US011209515B2

(12) United States Patent
Kaneko et al.

(10) Patent No.: US 11,209,515 B2
(45) Date of Patent: Dec. 28, 2021

(54) METHOD OF DETERMINING CORRECTION FUNCTION

(71) Applicant: Tokyo Electron Limited, Tokyo (JP)

(72) Inventors: Kazushi Kaneko, Miyagi (JP); Yohei Ishida, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 67 days.

(21) Appl. No.: 16/848,510

(22) Filed: Apr. 14, 2020

(65) Prior Publication Data

US 2020/0341106 A1 Oct. 29, 2020

(30) Foreign Application Priority Data

Apr. 23, 2019 (JP) .............................. JP2019-082216

(51) Int. Cl.
| | |
|---|---|
| *G01R 35/00* | (2006.01) |
| *G01R 29/08* | (2006.01) |
| *G01R 27/28* | (2006.01) |
| *G01R 27/02* | (2006.01) |
| *G01R 27/26* | (2006.01) |
| *G01R 31/319* | (2006.01) |

(52) U.S. Cl.
CPC ............ *G01R 35/005* (2013.01); *G01R 27/02* (2013.01); *G01R 27/2605* (2013.01); *G01R 27/28* (2013.01); *G01R 29/08* (2013.01); *G01R 31/3191* (2013.01); *G01R 35/00* (2013.01); *H01L 2924/00* (2013.01); *H01L 2924/0002* (2013.01)

(58) Field of Classification Search
CPC ...... G01R 35/005; G01R 35/00; G01R 27/28; G01R 27/02; G01R 27/2605; G01R 31/3191; G01R 29/08; G01R 21/01; H01L 2924/0002; H01L 2924/00; H01L 21/3065; H01J 37/32311
USPC .... 324/74, 76.11–76.83, 202, 459, 600, 601, 324/619
See application file for complete search history.

(56) References Cited

U.S. PATENT DOCUMENTS

| | | | | |
|---|---|---|---|---|
| 2017/0317697 | A1* | 11/2017 | Motoi ..................... | H03F 1/565 |
| 2020/0013587 | A1* | 1/2020 | Kaneko ............. | H01J 37/32211 |
| 2020/0341043 | A1* | 10/2020 | Kaneko ................ | G01R 35/005 |

FOREIGN PATENT DOCUMENTS

JP H06-267900 A 9/1994

* cited by examiner

*Primary Examiner* — Raul J Rios Russo
(74) *Attorney, Agent, or Firm* — Studebaker & Brackett PC

(57) ABSTRACT

A method includes setting a setting duty ratio of a pulse to a predefined first setting duty ratio, detecting a measured value of power of a microwave, and calculating an error of the measured value of the power with respect to the setting power level for each setting power level, calculating a correction value for the power for each setting power level on the basis of the error, and determining a first function indicating a relationship between the setting power level and the correction value by logarithmically approximating the relationship between the setting power level and the correction value, and determining the correction function indicating a relationship among the setting duty ratio, the setting power level, and the correction value by approximating the correction value defined by the first function, and the predefined correction value at a setting duty ratio of 100%, with a linear function.

14 Claims, 17 Drawing Sheets

METHOD OF DETERMINING CORRECTION FUNCTION

CROSS-REFERENCE TO RELATED APPLICATIONS

This application is based on and claims the benefit of priority from Japanese Patent Application No. 2019-082216 filed on Apr. 23, 2019, and the entire contents of which are incorporated herein by reference.

TECHNICAL FIELD

The present disclosure relates to a method of determining a correction function.

BACKGROUND

Japanese Unexamined Patent Publication No. H6-267900 discloses an apparatus which pulse-modulates a microwave for exciting plasma.

SUMMARY

In an exemplary embodiment, a method of determining a correction function for correcting an error in a wave detector is provided. A microwave output device measures, by using the wave detector, power of a microwave which is output from a microwave generator and is pulse-modulated, and controls the microwave generator such that a measurement result matches setting power. The method includes a measurement step, an approximation step, and a determination step. In the measurement step, a setting duty ratio of a pulse is set to a predefined first setting duty ratio. A measured value of the power of the microwave output from the microwave generator is detected by using a calibration measuring device for each setting power level with regard to at least two setting power levels. An error of the measured value of the power with respect to the setting power level is calculated for each setting power level. In the approximation step, a correction value for the power is calculated for each setting power level on the basis of the error. A first function indicating a relationship between the setting power level and the correction value at the first setting duty ratio is determined by logarithmically approximating the relationship between the setting power level and the correction value. In the determination step, the correction value at the first setting duty ratio, defined by the first function, and the predefined correction value at a setting duty ratio of 100% are approximated with a linear function. Consequently, the correction function indicating a relationship among the setting duty ratio, the setting power level, and the correction value is determined.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
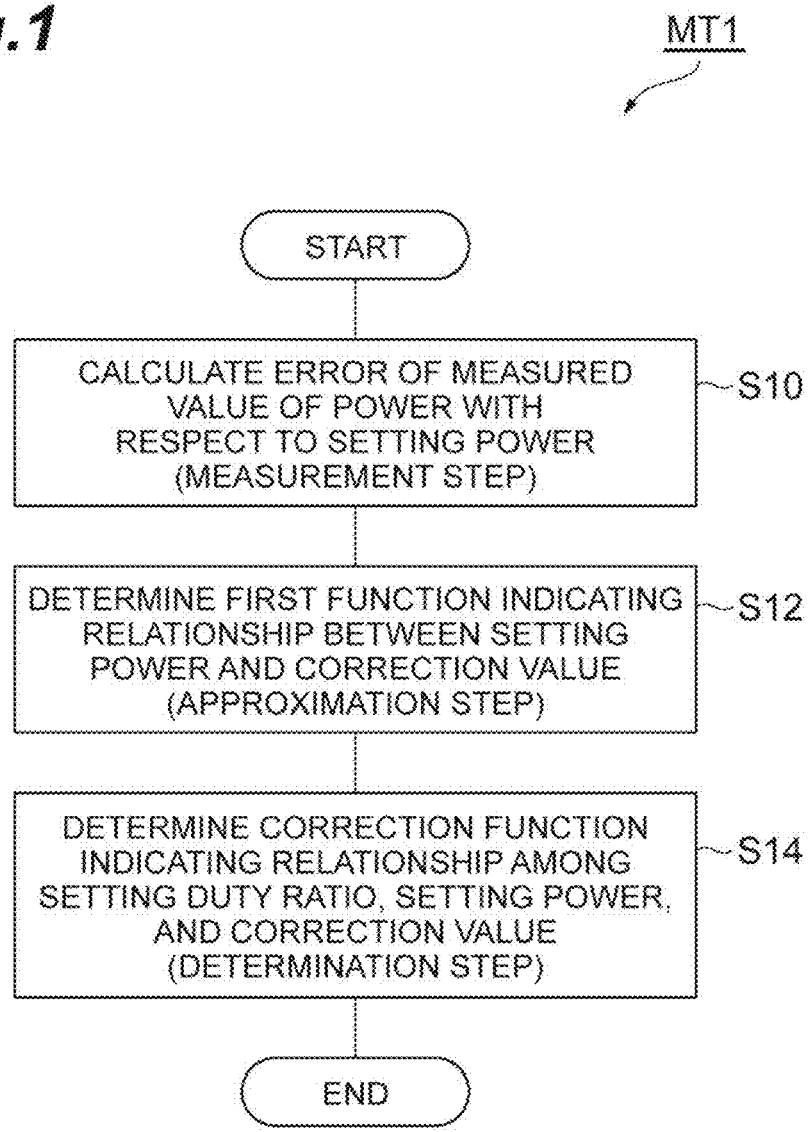
FIG. 1 is a flowchart illustrating an example of a method according to an embodiment.

In the following detailed description, reference is made to the accompanying drawings, which form a part hereof. The exemplary embodiments described in the detailed description, drawing, and claims are not meant to be limiting. Other exemplary embodiments may be utilized, and other changes may be made, without departing from the spirit or scope of the subject matter presented here.

Hereinafter, various exemplary embodiments will be described.

In an electronic device manufacturing field, achievement of low power of a microwave progresses in order to further reduce damage to an object to be processed. However, if power of a microwave is too low, there is concern that plasma may become unstable or a misfire may occur. Thus, power of a microwave may be pulse-modulated as in the apparatus disclosed in Japanese Unexamined Patent Publication No. H6-267900. In such pulse modulation, power of a travelling wave output from the microwave output device is required to be pulse-modulated with high accuracy.

In a case where a microwave output device controls power by using a measurement result from a wave detector, the accuracy of the measurement result from the wave detector influences the accuracy of power of a microwave. Thus, in a case where an error in the wave detector can be measured and corrected by using a calibration measuring device before shipment of the device, it is possible to provide the microwave output device enabling the accuracy of power to be improved. However, findings that an error in the wave detector differs depending on setting power or a pulse condition have been obtained. Thus, in order to cope with any process, it is necessary to determine a correction value by comparing all process conditions with power measured by the calibration measuring device.

The present disclosure provides a method capable of easily determining a correction value for correcting an error in a wave detector detecting a microwave which is pulse-modulated such that power thereof is turned on and off.

In an exemplary embodiment, a method of determining a correction function for correcting an error in a wave detector is provided. A microwave output device measures, by using the wave detector, power of a microwave which is output from a microwave generator and is pulse-modulated, and controls the microwave generator such that a measurement result matches setting power. The method includes a measurement step, an approximation step, and a determination step. In the measurement step, a setting duty ratio of a pulse is set to a predefined first setting duty ratio. A measured value of the power of the microwave output from the microwave generator is detected by using a calibration measuring device for each setting power level with regard to at least two setting power levels. An error of the measured value of the power with respect to the setting power level is calculated for each setting power level. In the approximation step, a correction value for the power is calculated for each setting power level on the basis of the error. A first function indicating a relationship between the setting power level and the correction value at the first setting duty ratio is determined by logarithmically approximating the relationship between the setting power level and the correction value. In the determination step, the correction value at the first setting duty ratio, defined by the first function, and the predefined correction value at a setting duty ratio of 100% are approximated with a linear function. Consequently, the correction function indicating a relationship among the setting duty ratio, the setting power level, and the correction value is determined.

In this method, an error between setting power and a measured value of the power measured by the calibration measuring device is measured with regard to at least two setting power levels. A correction value for the power is calculated for each setting power level on the basis of the error. A first function indicating a relationship between the setting power level and the correction value at the first setting duty ratio is determined by logarithmically approximating the relationship between the setting power level and the correction value. In the determination step, the correction value at the first setting duty ratio, defined by the first function, and the predefined correction value at a setting duty ratio of 100% are approximated with a linear function. Consequently, the correction function indicating a relationship among the setting duty ratio, the setting power level, and the correction value is determined. As mentioned above, according to the method, if errors of at least two measured power levels have only to be measured, a correction function for correcting an error of power in any process condition can be determined. Therefore, according to the method, it is possible to easily determine a correction value compared with a method of determining a correction value through comparison with power measured by a calibration measuring device with respect to all process conditions.

In an exemplary embodiment, the predefined correction value at the setting duty ratio of 100% may be 0. Consequently, a correction function can be easily approximated with a linear function.

In an exemplary embodiment, the correction function may be a function for determining a correction value at a duty ratio equal to or higher than the first setting duty ratio, and in the determination step, a correction function at the first setting duty ratio or less may be separately determined. The accuracy of a correction function is reduced in a process condition in which a duty ratio is lower than the first setting duty ratio. Thus, a correction function at a duty ratio lower than the first setting duty ratio is separately determined, and thus a correction function at a setting duty ratio in the entire range can be determined with high accuracy.

In an exemplary embodiment, the microwave may have a single frequency peak. In this case, it is possible to improve the accuracy of power of the microwave having the single frequency peak.

In an exemplary embodiment, the correction function applied to a microwave having a single frequency peak may be determined by executing the measurement step, the approximation step, and the determination step by using the microwave having the single frequency peak. The method may further include a second measurement step, a calculation step, a second approximation step, a second determination step, and a third determination step. In the second measurement step, a setting duty ratio of a pulse is set to a predefined second setting duty ratio. A measured value of the power of the microwave having a bandwidth, output from the microwave generator is detected by using the calibration measuring device for each setting power level with regard to at least two setting power levels. An error of the measured value of the power with respect to the setting power level is calculated for each setting power level. In the calculation step, a difference between the error applied to the microwave having the single frequency peak and the error applied to the microwave having the bandwidth is calculated for each setting power level. In the second approximation step, a revision value with respect to the correction value for the power of the microwave having the single frequency peak is calculated for each setting power level on the basis of the difference. A second function indicating a relationship between the setting power level and the revision value at the second setting duty ratio is determined by logarithmically approximating the relationship between the setting power level and the revision value. In the second determination step, the revision value at the second setting duty ratio, defined by the second function, and the predefined revision value at the setting duty ratio of 100% are approximated with a linear function. Consequently, a revision term indicating a relationship among the setting duty ratio, the setting power level, and the revision value is determined. In the third determination step, the correction function applied to the microwave having the bandwidth is determined on the basis of the revision term and the correction function applied to the microwave having the single frequency peak. According to the method, it is possible to obtain a correction function for a microwave having a bandwidth by revising a correction function for a microwave having a single frequency peak.

Hereinafter, various embodiments will be described in detail with reference to the drawings. In the following description and drawings, the same reference numeral will be given to the same portion or an equivalent portion, and overlapping description will not be repeated. A dimension ratio in the drawing does not necessarily match a described dimension ratio. The terms "upper", "lower", "left", and "right" are based on illustrated states and are terms for convenience.

Figure 2:
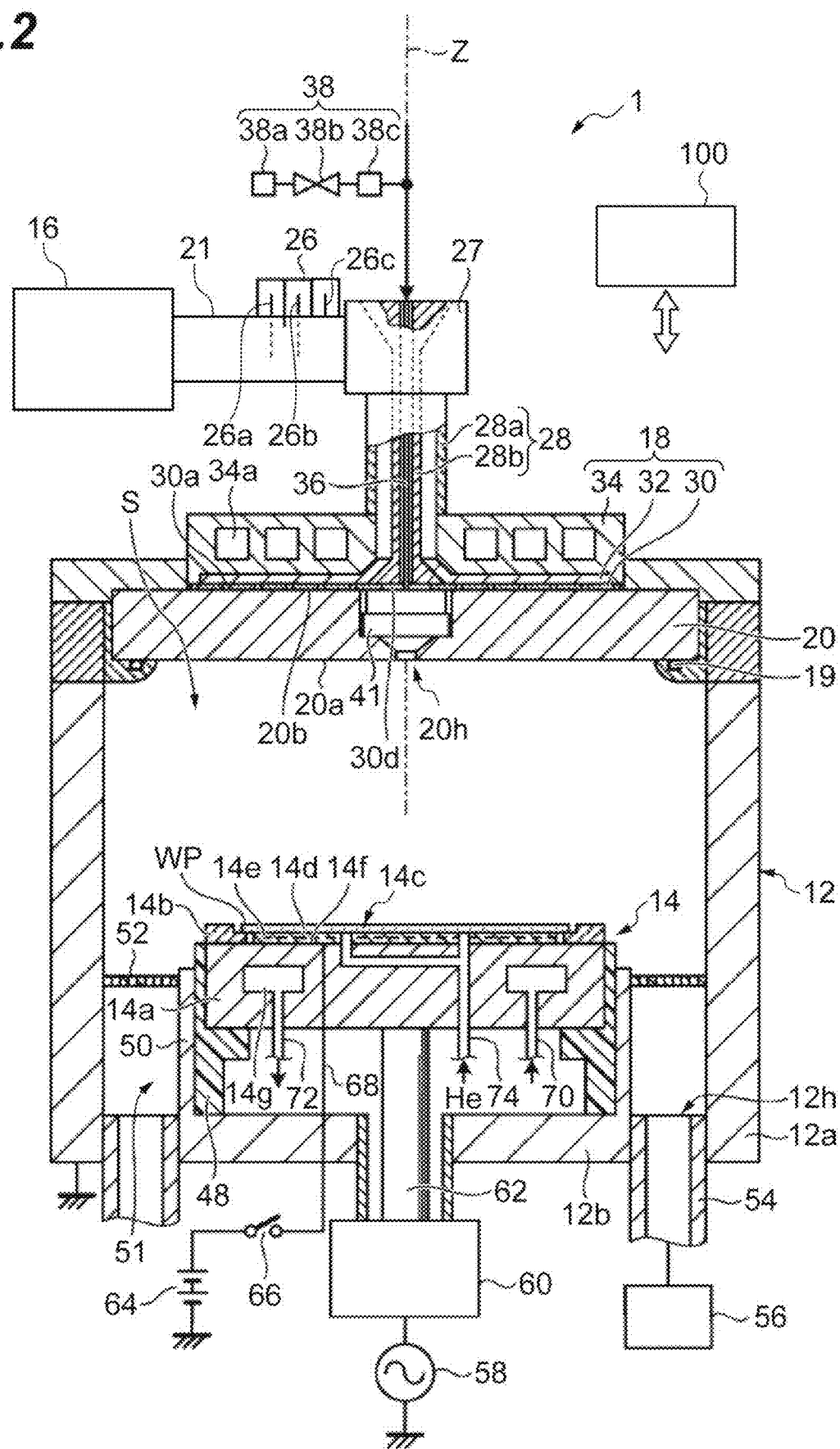
FIG. 2 is a diagram illustrating an exemplary plasma processing apparatus which can be used to execute the method illustrated in FIG. 1.

FIG. 1 is a flowchart illustrating an example of a method according to an embodiment. A method MT1 illustrated in FIG. 1 is a method of determining a correction function for correcting an error in a wave detector. A correction function determined according to the method MT1 is applied to a microwave output device which measures power of a microwave output from a microwave generator and is pulse-modulated, by using a wave detector, and controls the microwave generator such that a measurement result matches setting power. As an example, a plasma processing apparatus is used to execute the method MT1. FIG. 2 is a diagram schematically illustrating an example of a plasma processing apparatus which can be used to execute the method MT1. As illustrated in FIG. 2, a plasma processing apparatus 1 includes a chamber main body 12 and a microwave output device 16. The plasma processing apparatus 1 may further include a stage 14, an antenna 18, and a dielectric window 20.

The chamber main body 12 provides a processing space S at the inside thereof. The chamber main body 12 includes a side wall 12a and a bottom portion 12b. The side wall 12a is formed in an approximately cylindrical shape. A central axis of the side wall 12a approximately matches an axis Z which extends in a vertical direction. The bottom portion 12b is provided on a lower end side of the side wall 12a. An exhaust hole 12h for exhaust is provided in the bottom portion 12b. An upper end of the side wall 12a is an opening.

The dielectric window 20 is provided over the upper end of the side wall 12a. The dielectric window 20 includes a lower surface 20a which faces the processing space S. The dielectric window 20 closes the opening in the upper end of the side wall 12a. An O-ring 19 is interposed between the dielectric window 20 and the upper end of the side wall 12a. The chamber main body 12 is more reliably sealed due to the O-ring 19.

The stage 14 is accommodated in the processing space S. The stage 14 is provided to face the dielectric window 20 in the vertical direction. The stage 14 is provided such that the processing space S is provided between the dielectric window 20 and the stage 14. The stage 14 is configured to support a workpiece WP (for example, a wafer) which is mounted thereon.

In an embodiment, the stage 14 includes a base 14a and an electrostatic chuck 14c. The base 14a has an approximately disc shape, and is formed from a conductive material such as aluminum. A central axis of the base 14a approximately matches the axis Z. The base 14a is supported by a cylindrical support 48. The cylindrical support 48 is formed from an insulating material, and extends from the bottom portion 12b in a vertically upward direction. A conductive cylindrical support 50 is provided on an outer circumference of the cylindrical support 48. The cylindrical support 50 extends from the bottom portion 12b of the chamber main body 12 along the outer circumference of the cylindrical support 48 in a vertically upward direction. An annular exhaust path 51 is formed between the cylindrical support 50 and the side wall 12a.

A baffle plate 52 is provided at an upper portion of the exhaust path 51. The baffle plate 52 has an annular shape. A plurality of through-holes, which pass through the baffle plate 52 in a plate thickness direction, are formed in the baffle plate 52. The above-described exhaust hole 12h is provided on a lower side of the baffle plate 52. An exhaust device 56 is connected to the exhaust hole 12h through an exhaust pipe 54. The exhaust device 56 includes an automatic pressure control valve (APC), and a vacuum pump such as a turbo-molecular pump. A pressure inside the processing space S may be reduced to a desired vacuum degree by the exhaust device 56.

The base 14a also functions as a radio frequency electrode. A radio frequency power supply 58 for radio frequency bias is electrically connected to the base 14a through a feeding rod 62 and a matching unit 60. The radio frequency power supply 58 outputs a constant frequency which is suitable to control ion energy which is inducted to the workpiece WP, for example, a radio frequency of 13.56 MHz with power which is set.

The radio frequency power supply 58 may have a pulse generator, and may pulse-modulate radio frequency power (RF power) which is then applied to the base 14a. In this case, the radio frequency power supply 58 pulse-modulates the radio frequency power such that high level power and low level power are periodically repeated. The radio frequency power supply 58 performs pulse adjustment on the basis of a synchronization signal PSS-R generated by the pulse generator. The synchronization signal PSS-R is a signal for determining a cycle and a duty ratio of the radio frequency power. As an example of setting during pulse modulation, a pulse frequency is 10 Hz to 250 kHz, and a duty ratio of a pulse (a ratio of a high level power time to a pulse cycle) is 10% to 90%.

The matching unit 60 accommodates a matching device configured to attain matching between impedance on the radio frequency power supply 58 side, and impedance mainly on a load side such as an electrode, plasma, and the chamber main body 12. A blocking capacitor for self-bias generation is included in the matching device. In a case where radio frequency power is pulse-modulated, the matching unit 60 is operated to perform matching on the basis of the synchronization signal PSS-R.

The electrostatic chuck 14c is provided on an upper surface of the base 14a. The electrostatic chuck 14c holds the workpiece WP with an electrostatic suction force. The electrostatic chuck 14c includes an electrode 14d, an insulating film 14e, and an insulating film 14f, and has an approximately disc shape. A central axis of the electrostatic chuck 14c approximately matches the axis Z. The electrode 14d of the electrostatic chuck 14c is configured with a conductive film, and is provided between the insulating film 14e and the insulating film 14f. A DC power supply 64 is electrically connected to the electrode 14d through a switch 66 and a covered wire 68. The electrostatic chuck 14c can suction and hold the workpiece WP by a coulomb's force which is generated by a DC voltage applied from the DC power supply 64. A focus ring 14b is provided on the base 14a. The focus ring 14b is disposed to surround the workpiece WP and the electrostatic chuck 14c.

A coolant chamber 14g is provided at the inside of the base 14a. For example, the coolant chamber 14g is formed to extend around the axis Z. A coolant is supplied into the coolant chamber 14g from a chiller unit through a pipe 70. The coolant, which is supplied into the coolant chamber 14g, returns to the chiller unit through a pipe 72. A temperature of the coolant is controlled by the chiller unit, and thus a temperature of the electrostatic chuck 14c and a temperature of the workpiece WP are controlled.

A gas supply line 74 is formed in the stage 14. The gas supply line 74 is provided to supply a heat transfer gas, for example, a He gas to a space between an upper surface of the electrostatic chuck 14c and a rear surface of the workpiece WP.

The microwave output device 16 outputs a microwave which excites a process gas which is supplied into the chamber main body 12. The microwave output device 16 is configured to variably adjust a frequency, power, and a bandwidth of the microwave. The microwave output device 16 may generate a microwave having a single frequency by setting, for example, a bandwidth of the microwave to substantially 0. The microwave output device 16 may generate a microwave having a bandwidth having a plurality of frequency components. Power levels of the plurality of frequency components may be the same as each other, and only a center frequency component in the bandwidth may have a power level higher than power levels of other frequency components. In an example, the microwave output device 16 may adjust the power of the microwave in a range of 0 W to 5000 W. The microwave output device 16 may adjust the frequency or the center frequency of the microwave in a range of 2400 MHz to 2500 MHz. The microwave output device 16 may adjust the bandwidth of the microwave in a range of 0 MHz to 400 MHz. The microwave output device 16 may adjust a frequency pitch (carrier pitch) of the plurality of frequency components of the microwave in the bandwidth in a range of 0 to 25 kHz.

The microwave output device 16 may include a pulse generator, and may pulse-modulate and output power of a microwave. In this case, the microwave output device 16 pulse-modulates the microwave such that high level power and low level power are periodically repeated. The microwave output device 16 adjusts a pulse on the basis of a synchronization signal PSS-M generated by the pulse generator. The synchronization signal PSS-M is a signal for determining a cycle and a duty ratio of microwave power. As an example of setting during pulse modulation, a pulse frequency is 1 Hz to 50 kHz, and a duty ratio of a pulse (a ratio of a high level power time to a pulse cycle) is 10% to 90%. The microwave output device 16 may pulse-modulate microwave power to be synchronized with radio frequency power pulse-modulated, output from the radio frequency power supply 58.

The plasma processing apparatus 1 further includes a wave guide tube 21, a tuner 26, a mode converter 27, and a coaxial wave guide tube 28. An output unit of the microwave output device 16 is connected to one end of the wave guide tube 21. The other end of the wave guide tube 21 is connected to the mode converter 27. For example, the wave guide tube 21 is a rectangular wave guide tube. The tuner 26 is provided in the wave guide tube 21. The tuner 26 has stubs 26a, 26b, and 26c. Each of the stubs 26a, 26b, and 26c is configured to adjust a protrusion amount thereof with respect to an inner space of the wave guide tube 21. The tuner 26 adjusts a protrusion position of each of the stubs 26a, 26b, and 26c with respect to a reference position so as to match impedance of the microwave output device 16 with impedance of a load, for example, impedance of the chamber main body 12.

The mode converter 27 converts a mode of the microwave transmitted from the wave guide tube 21, and supplies the microwave having undergone mode conversion to the coaxial wave guide tube 28. The coaxial wave guide tube 28 includes an outer conductor 28a and an inner conductor 28b. The outer conductor 28a has an approximately cylindrical shape, and a central axis thereof approximately matches the axis Z. The inner conductor 28b has an approximately cylindrical shape, and extends on an inner side of the outer conductor 28a. A central axis of the inner conductor 28b approximately matches the axis Z. The coaxial wave guide tube 28 transmits the microwave from the mode converter 27 to the antenna 18.

The plasma processing apparatus 1 may be provided with a power meter (an example of a calibration measuring device) in the wave guide tube 21. The power meter is, for example, a thermocouple type sensor measuring power of a microwave. The power meter measures a travelling wave and a reflected wave between the tuner 26 and the mode converter 27 or between the microwave output device 16 and the tuner 26 in the wave guide tube 21. An example of disposition of the power meter will be described later.

The antenna 18 is provided on a surface 20b opposite to the lower surface 20a of the dielectric window 20. The antenna 18 includes a slot plate 30, a dielectric plate 32, and a cooling jacket 34.

The slot plate 30 is provided on a surface 20b of the dielectric window 20. The slot plate 30 is formed from a conductive metal, and has an approximately disc shape. A central axis of the slot plate 30 approximately matches the axis Z. A plurality of slot holes 30a are formed in the slot plate 30. In an example, the plurality of slot holes 30a constitute a plurality of slot pairs. Each of the plurality of slot pairs includes two slot holes 30a which extend in directions interesting each other and have an approximately elongated hole shape. The plurality of slot pairs are arranged along one or more concentric circles centering around the axis Z. In addition, a through-hole 30d through which a conduit 36 to be described later can pass is formed in the central portion of the slot plate 30.

The dielectric plate 32 is formed on the slot plate 30. The dielectric plate 32 is formed from a dielectric material such as quartz, and has an approximately disc shape. A central axis of the dielectric plate 32 approximately matches the axis Z. The cooling jacket 34 is provided on the dielectric plate 32. The dielectric plate 32 is provided between the cooling jacket 34 and the slot plate 30.

A surface of the cooling jacket 34 has conductivity. A flow passage 34a is formed at the inside of the cooling jacket 34. A coolant is supplied to the flow passage 34a. A lower end of the outer conductor 28a is electrically connected to an upper surface of the cooling jacket 34. A lower end of the inner conductor 28b passes through a hole formed in a central portion of the cooling jacket 34 and the dielectric plate 32 and is electrically connected to the slot plate 30.

A microwave from the coaxial wave guide tube 28 propagates through the inside of the dielectric plate 32 and is supplied to the dielectric window 20 from the plurality of slot holes 30a of the slot plate 30. The microwave, which is supplied to the dielectric window 20, is introduced into the processing space S.

The conduit 36 passes through an inner hole of the inner conductor 28b of the coaxial wave guide tube 28. As described above, the through-hole 30d, through which the conduit 36 can pass, is formed at the central portion of the slot plate 30. The conduit 36 extends to pass through the inner hole of the inner conductor 28b, and is connected to a gas supply system 38.

The gas supply system 38 supplies a process gas for processing the workpiece WP to the conduit 36. The gas supply system 38 may include a gas source 38a, a valve 38b, and a flow rate controller 38c. The gas source 38a is a gas source of the process gas. The valve 38b switches supply and supply stoppage of the process gas from the gas source 38a. For example, the flow rate controller 38c is a mass flow controller, and adjusts a flow rate of the process gas from the gas source 38a.

The plasma processing apparatus 1 may further include an injector 41. The injector 41 supplies a gas from the conduit 36 to a through-hole 20h which is formed in the dielectric window 20. The gas, which is supplied to the through-hole 20h of the dielectric window 20, is supplied to the processing space S. The process gas is excited by a microwave which is introduced into the processing space S from the dielectric window 20. According to this, plasma is generated in the processing space S, and the workpiece WP is processed by active species such as ions and/or radicals from the plasma.

The plasma processing apparatus 1 further includes a controller 100. The controller 100 collectively controls respective units of the plasma processing apparatus 1. The controller 100 may include a processor such as a CPU, a user interface, and a storage unit.

The processor executes a program and a process recipe which are stored in the storage unit so as to collectively control respective units such as the microwave output device 16, the stage 14, the gas supply system 38, and the exhaust device 56.

The user interface includes a keyboard or a touch panel with which a process manager performs a command input operation and the like so as to manage the plasma processing apparatus 1, a display which visually displays an operation situation of the plasma processing apparatus 1 and the like.

The storage unit stores control programs (software) for realizing various kinds of processing executed by the plasma processing apparatus 1 by a control of the processor, a process recipe including process condition data and the like, and the like. The processor calls various kinds of control programs from the storage unit and executes the control programs in correspondence with necessity including an instruction from the user interface. Desired processing is executed in the plasma processing apparatus 1 under the control of the processor.

Configuration example of microwave output device 16

Figure 3:
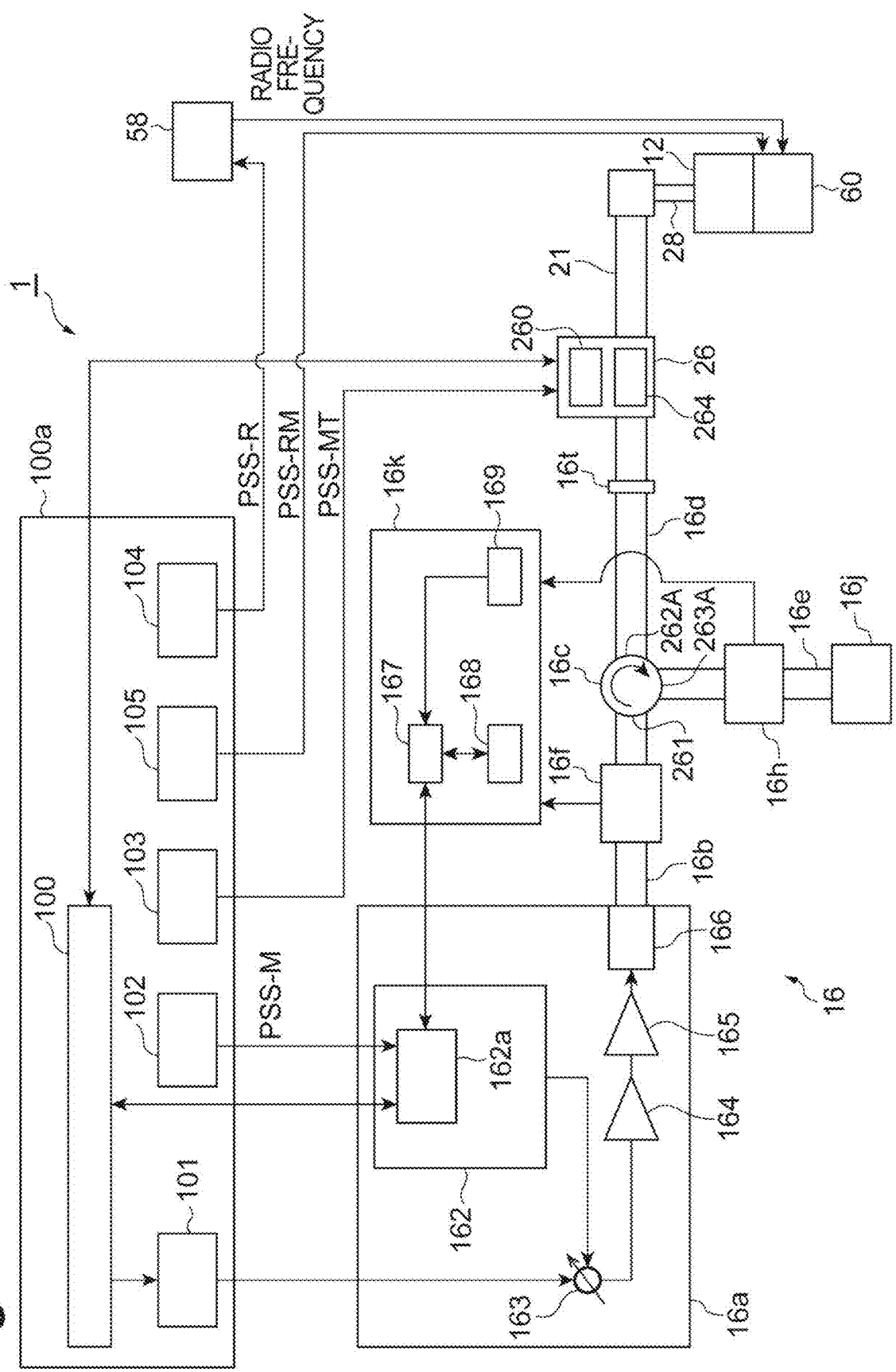
FIG. 3 is a diagram illustrating an example of a microwave output device.

FIG. 3 is a diagram illustrating an example of the microwave output device. As illustrated in FIG. 3, the microwave output device 16 is connected to a calculation device 100a. The calculation device 100a includes a controller 100, a waveform generator 101, a first pulse generator 102, a second pulse generator 103, a third pulse generator 104, and a fourth pulse generator 105.

The waveform generator 101 generates a waveform of a microwave. The waveform generator 101 generates a waveform of a microwave having a center frequency and a bandwidth respectively corresponding to a setting frequency and a setting bandwidth designated by the controller 100. The waveform generator 101 outputs the waveform of the microwave to the microwave output device 16.

The first pulse generator 102 generates a synchronization signal used to pulse-modulate microwave power in the microwave output device 16. The first pulse generator 102 generates the synchronization signal PSS-M on the basis of a setting pulse frequency and a setting duty ratio of microwave power in a setting profile which is set by the controller 100. The first pulse generator 102 outputs the synchronization signal PSS-M to the microwave output device 16.

The second pulse generator 103 generates a synchronization signal which is used to subject microwave power of which power is pulse-modulated to impedance matching in the tuner 26. In the same manner as the first pulse generator 102, the second pulse generator 103 generates a synchronization signal PSS-MT on the basis of a setting pulse frequency and a setting duty ratio of microwave power in a setting profile which is set by the controller 100. The synchronization signal PSS-MT has the same pulse frequency and duty ratio as those of the synchronization signal PSS-M. The second pulse generator 103 outputs the synchronization signal PSS-MT to the tuner 26.

The third pulse generator 104 generates a synchronization signal which is used to pulse-modulate radio frequency power in the radio frequency power supply 58. The third pulse generator 104 generates a synchronization signal PSS-R on the basis of a setting pulse frequency and a setting duty ratio of radio frequency power in a setting profile which is set by the controller 100. The third pulse generator 104 outputs the synchronization signal PSS-R to the radio frequency power supply 58.

The fourth pulse generator 105 generates a synchronization signal which is used to subject a radio frequency of which power is pulse-modulated to impedance matching in the matching unit 60. In the same manner as the third pulse generator 104, the fourth pulse generator 105 generates a synchronization signal PSS-RM on the basis of a setting pulse frequency and a setting duty ratio of radio frequency power in a setting profile which is set by the controller 100. The synchronization signal PSS-RM has the same pulse frequency and duty ratio as those of the synchronization signal PSS-R. The fourth pulse generator 105 outputs the synchronization signal PSS-RM to the matching unit 60.

The first pulse generator 102 may generate the synchronization signal PSS-M which is synchronized with the synchronization signal PSS-R. In this case, pulse-modulation of microwave power and pulse-modulation of radio frequency power can be synchronized with each other, and thus it is possible to stably generate plasma.

The microwave output device 16 pulse-modulates the waveform of the microwave generated by the waveform generator 101 according to the setting in the controller 100, and outputs the microwave. The microwave output device 16 includes a microwave generator 16a, a wave guide tube 16b, a circulator 16c, a wave guide tube 16d, a wave guide tube 16e, a first directional coupler 16f, a second directional coupler 16h, a measurement unit 16k (an example of a wave detector), and a dummy load 16j.

The microwave generator 16a generates a microwave of which power is pulse-modulated. The microwave generator 16a acquires a setting pulse frequency, a setting duty ratio, high level setting power, and low level setting power for which instructions are given by the controller 100. The microwave generator 16a generates the microwave of which power is pulse-modulated so as to obtain a pulse frequency, a duty ratio, high level power, and low level power respectively corresponding to the settings for which instructions are given by the controller 100. In a case where the low level setting power is 0 W, the power is pulse-modulated to be turned on and off. Hereinafter, a description will be made of an example in which the power is pulse-modulated to be turned on and off.

The microwave generator 16a includes a power controller 162, an attenuator 163, an amplifier 164, an amplifier 165, and a mode converter 166.

The waveform generator 101 is connected to the attenuator 163. The attenuator 163 is a device which can change an attenuation amount (attenuation rate) according to an applied voltage value as an example. The attenuator 163 is connected to the power controller 162. The power controller 162 controls an attenuation rate (attenuation amount) of a microwave in the attenuator 163 by using an applied voltage value. The attenuation rate (attenuation amount) of a microwave is controlled such that a microwave output from the waveform generator 101 becomes a microwave having power corresponding to a setting pulse frequency, a setting duty ratio, and ON level setting power for which instructions are given by the controller 100.

The power controller 162 includes the control unit 162a as an example. The control unit 162a may be a processor. The control unit 162a acquires a setting profile from the controller 100. The control unit 162a acquires the synchronization signal PSS-M from the first pulse generator 102. The control unit 162a determines an attenuation rate (attenuation amount) of a microwave on the basis of the synchronization signal PSS-M, and the setting profile which is set by the controller 100.

An output of the attenuator 163 is connected to the mode converter 166 via the amplifier 164 and the amplifier 165. Each of the amplifier 164 and the amplifier 165 amplifies a microwave at a predetermined amplification rate. The mode converter 166 converts a propagation mode of a microwave output from the amplifier 165 from TEM into TE01. A microwave, which is generated through the mode conversion in the mode converter 166, is output as an output microwave of the microwave generator 16a.

An output of the microwave generator 16a is connected to one end of the wave guide tube 16b. The other end of the wave guide tube 16b is connected to a first port 261 of the circulator 16c. The circulator 16c includes a first port 261, a second port 262A, and a third port 263A. The circulator 16c outputs a microwave, which is input to the first port 261, from the second port 262A, and outputs a microwave, which is input to the second port 262A, from the third port 263A. One end of the wave guide tube 16d is connected to the second port 262A of the circulator 16c. The other end of the wave guide tube 16d is an output unit 16t of the microwave output device 16.

One end of the wave guide tube 16e is connected to the third port 263A of the circulator 16c. The other end of the wave guide tube 16e is connected to the dummy load 16j. The dummy load 16j receives a microwave which propagates through the wave guide tube 16e and absorbs the microwave. For example, the dummy load 16j converts the microwave into heat.

The first directional coupler 16f is provided between one end and the other end of the wave guide tube 16b. The first directional coupler 16f is configured to branch parts of microwaves (that is, travelling waves) which are output from the microwave generator 16a and propagate to the output unit 16t, and to output the parts of the travelling waves.

The second directional coupler 16h is provided between one end and the other end of the wave guide tube 16e. The second directional coupler 16h is configured to branch parts of reflected waves transmitted to the third port 263A of the circulator 16c with respect to microwaves (that is, reflected waves) which return to the output unit 16t, and to output the parts of the reflected waves.

The measurement unit 16k is a device which measures a microwave in the wave guide tube. The measurement unit 16k is provided on an output side of the microwave generator 16a, and includes a measurement controller 167, a first wave detector 168, and a second wave detector 169.

The first wave detector 168 detects a measured value corresponding to travelling wave power of a microwave in the wave guide tube. The first wave detector 168 receives a travelling wave output from the first directional coupler 16f. The second wave detector 169 detects a measured value corresponding to reflected wave power of a microwave in the wave guide tube. The second wave detector 169 receives a reflected wave output from the second directional coupler 16h.

The measurement controller 167 acquires average travelling wave power on the basis of a measured value detected by the first wave detector 168. The measurement controller 167 acquires average reflected wave power on the basis of a measured value detected by the second wave detector 169.

The measurement unit 16k is connected to the power controller 162. The measurement unit 16k outputs the measured values to the power controller 162. The power controller 162 divides each of the average travelling wave power and the average reflected wave power by a duty of the synchronization signal PSS-M, and uses division results as travelling wave power and the reflected wave power, respectively, when a pulse is in an ON period. The attenuator 163 is controlled such that a difference between power levels of a travelling wave and a reflected wave, that is, load power (effective power) matches setting power designated by the controller 100 (power feedback control).

The tuner 26 includes a tuner controller 260 and a tuner wave detector 264. The tuner controller 260 adjusts protrusion positions of the stubs 26a, 26b, and 26c such that impedance on the microwave output device 16 side matches impedance on the antenna 18 side on the basis of a signal from the controller 100 and a detection result from the tuner wave detector 264. The tuner wave detector 264 is a three-probe wave detector as an example, and has three probes with diodes. The tuner controller 260 causes a driver circuit and an actuator (not illustrated) to operate the stubs 26a, 26b, and 26c.

The tuner controller 260 acquires the synchronization signal PSS-MT for microwave power generated by the second pulse generator 103. The tuner controller 260 operates the stubs 26a, 26b, and 26c on the basis of the synchronization signal. The radio frequency power supply 58 acquires the synchronization signal PSS-R for radio frequency power generated by the third pulse generator 104. The radio frequency power supply 58 pulse-modulates radio frequency power on the basis of the synchronization signal PSS-R. The matching unit 60 acquires the synchronization signal PSS-MT for radio frequency power generated by the fourth pulse generator 105. The matching unit 60 performs matching on pulse-modulated radio frequency power on the basis of the synchronization signal PSS-MT.

Example of Disposition of Power Meter

Figure 4:
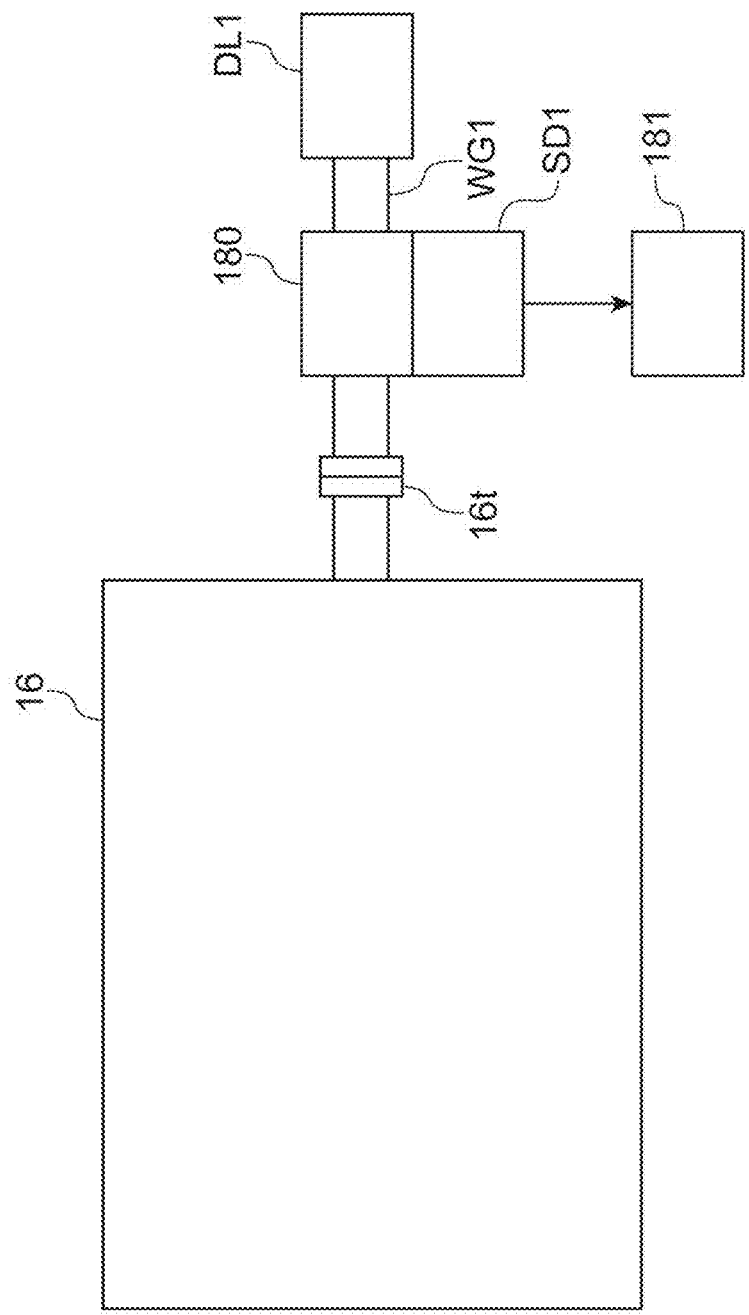
FIG. 4 is a diagram illustrating a configuration of an exemplary system including a microwave output device in preparing a correction coefficient.

FIG. 4 is a diagram illustrating a configuration of a system including a microwave output device in preparing a correction coefficient. As illustrated in FIG. 4, in preparing a plurality of first correction coefficients, the output unit 16t of the microwave output device 16 is connected to one end of a wave guide tube WG1. The other end of the wave guide tube WG1 is connected to a dummy load DL1. A third directional coupler 180 is provided between one end and the other end of the wave guide tube WG1. The third directional coupler 180 is connected to a sensor SD1. The sensor SD1 is connected to a power meter 181. The third directional coupler 180 branches parts of travelling waves propagating through the wave guide tube WG1. Parts of the travelling waves branched by the third directional coupler 180 are input to the sensor SD1. The sensor SD1 is, for example, a thermocouple type sensor, generates electromotive force which is proportional to power of a received microwave, and provides a DC output. The power meter 181 determines power of the travelling wave at the output unit 16t on the basis of the DC output from the sensor SD1.

Details of Waveform Generator

Figure 5:
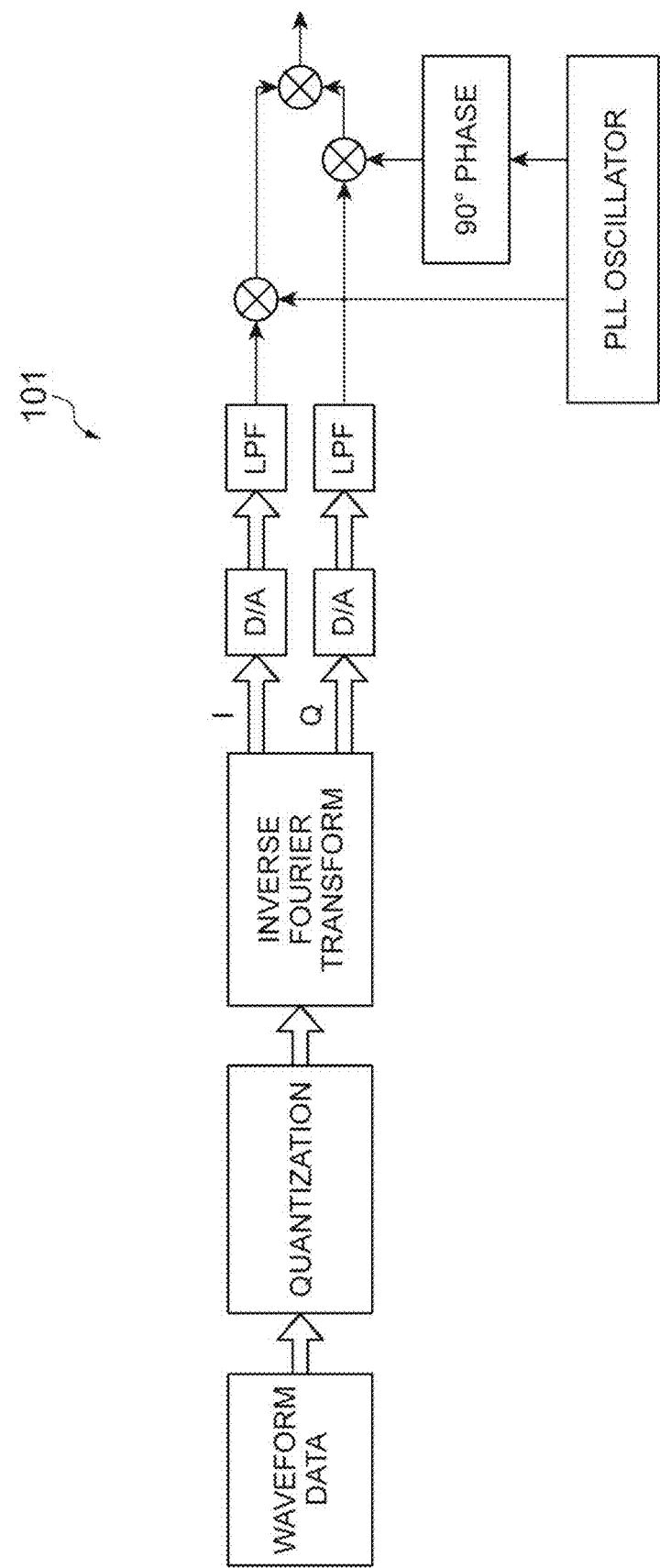
FIG. 5 is a diagram illustrating an exemplary microwave generation principle in a waveform generator.

FIG. 5 is a view illustrating a microwave generation principle in the waveform generator. As illustrated in FIG. 5, for example, the waveform generator 101 includes a phase locked loop (PLL) oscillator which can cause a microwave of which a phase is synchronized with that of a reference frequency to oscillate, and an IQ digital modulator which is connected to the PLL oscillator. The waveform generator 101 sets a frequency of a microwave which oscillates in the PLL oscillator to a setting frequency designated by the controller 100. The waveform generator 101 modulates a microwave from the PLL oscillator, and a microwave having a phase difference with the microwave from the PLL oscillator by 90° by using the IQ digital modulator. Consequently, the waveform generator 101 generates a microwave having a plurality of frequency components in a bandwidth or a microwave having a single frequency.

The waveform generator 101 may perform inverse discrete Fourier transform on, for example, N complex data symbols so as to generate a continuous signal and thus to generate a microwave having a plurality of frequency components. A method of generating such a signal may be a method such as an orthogonal frequency-division multiple access (OFDMA) modulation method used for digital TV broadcasting.

In an example, the waveform generator 101 has waveform data expressed by a digitalized code sequence in advance. The waveform generator 101 quantizes the waveform data, and applies the inverse Fourier transform to the quantized data so as to generate I data and Q data. The waveform generator 101 applies digital/analog (D/A) conversion to each of the I data and the Q data so as to obtain two analog signals. The waveform generator 101 inputs the analog signals to a low-pass filter (LPF) through which only a low frequency component passes. The waveform generator 101 mixes the two analog signals, which are output from the LPF, with a microwave from the PLL oscillator and a microwave having a phase difference with the microwave from the PLL oscillator by 90°, respectively. The waveform generator 101 combines microwaves which are generated through the mixing with each other. Consequently, the waveform generator 101 generates a microwave having a single frequency component or a plurality of frequency components.

Details of Measurement Unit

Figure 6:
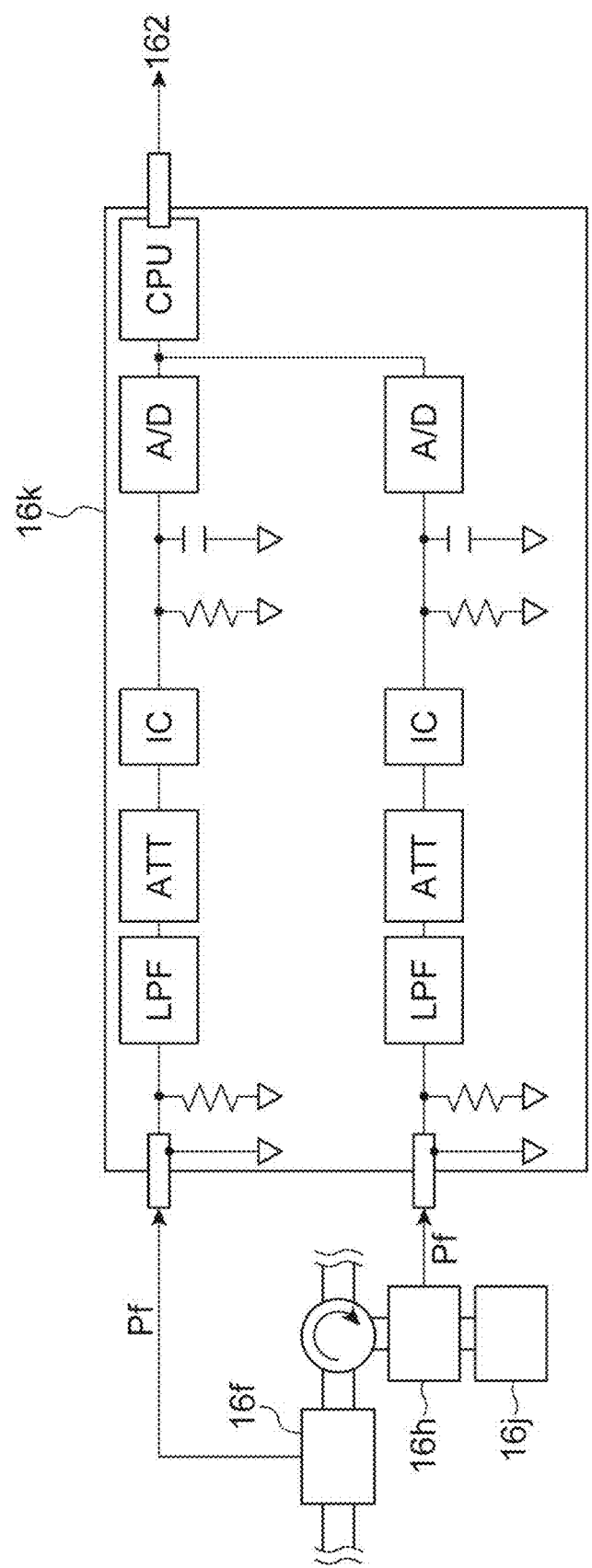
FIG. 6 is a diagram illustrating an example of a measurement unit.

FIG. 6 is a diagram illustrating an example of the measurement unit 16k. The measurement unit 16k includes a circuit, corresponding to the first wave detector 168, processing a travelling wave of a microwave, and a circuit, corresponding to the second wave detector 169, processing a reflected wave of a microwave. First, processing of a travelling wave of a microwave will be described. The measurement unit 16k receives travelling wave power Pf of a microwave via a port. The measurement unit 16k removes an unnecessary frequency component of the travelling wave power Pf by using a low-pass filter LPF. Next, the measurement unit 16k attenuates the travelling wave power Pf to a signal level appropriately for a subsequent circuit IC by using an attenuator ATT. Next, the measurement unit 16k converts the travelling wave power Pf into an analog voltage corresponding to the power by using the circuit IC. Next, the measurement unit 16k removes a noise component by averaging the travelling wave power Pf by using a circuit. The measurement unit 16k removes the noise component, and then converts the travelling wave power Pf into a digital signal by using an A/D converter. The processes hitherto correspond to functions of the first wave detector 168. Next, the measurement unit 16k performs linearlization or correction using wave detection characteristics on the digital signal by using the CPU, and outputs the digital signal from a port. An example of an output destination is the power controller 162. The process of the CPU corresponds to a function of the measurement controller 167. As mentioned above, the measurement unit 16k can detect travelling wave power, and output the travelling wave power to the power controller 162. Processing of a reflected wave is the same as the processing of a travelling wave. The measurement unit 16k removes an unnecessary frequency component of reflected wave power Pr by using a low-pass filter LPF. Next, the measurement unit 16k attenuates the reflected wave power Pr to a signal level appropriately for the subsequent circuit IC by using the attenuator ATT. Next, the measurement unit 16k converts the reflected wave power Pr into an analog voltage corresponding to the power by using the circuit IC. Next, the measurement unit 16k removes a noise component by averaging the reflected wave power Pr by using a circuit. The measurement unit 16k removes the noise component, and then converts the reflected wave power Pr into a digital signal by using the A/D converter. The processes hitherto correspond to functions of the second wave detector 169. Next, the measurement unit 16k performs linearlization or correction using wave detection characteristics on the digital signal by using the CPU, and outputs the digital signal from a port. An example of an output destination is the power controller 162. The process of the CPU corresponds to a function of the measurement controller 167. As mentioned above, the measurement unit 16k can detect reflected wave power, and output the reflected wave power to the power controller 162.

Example of Microwave

Figure 7:
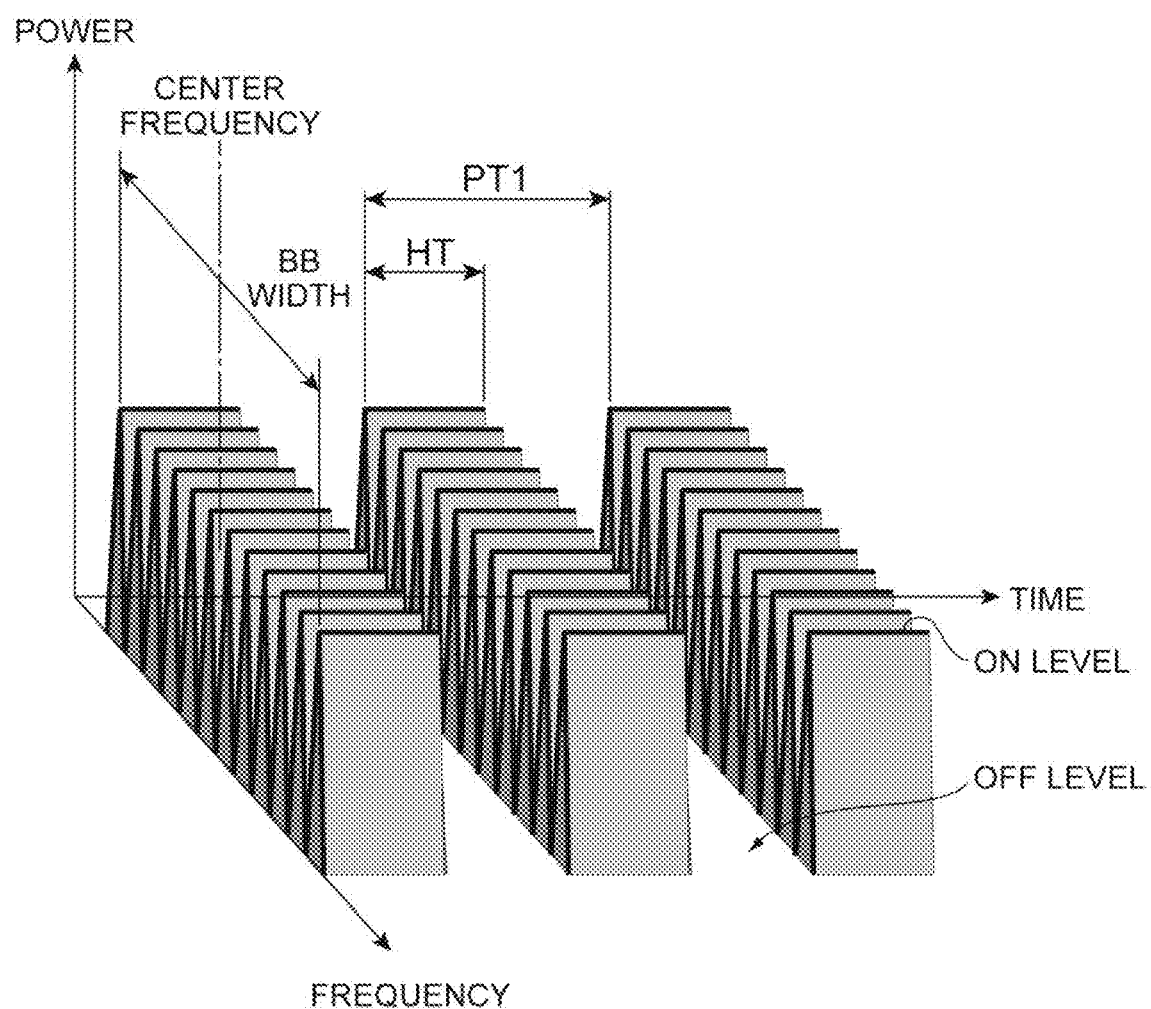
FIG. 7 is a diagram illustrating an example of a microwave of which power is pulse-modulated.

Power of a microwave output from the microwave generator 16a has a waveform modulated in a pulsed shape such that ON level power and OFF level power (0 W) are repeated. FIG. 7 illustrates an example of a microwave of which power is pulse-modulated to be turned on and off. As illustrated in FIG. 7, the microwave has a center frequency and a bandwidth (BB width) respectively corresponding to a setting frequency and a setting bandwidth for which instructions are given by the controller 100. The microwave has a pulse frequency PT1, a duty ratio HT, and ON level power respectively corresponding to a setting pulse frequency, a setting duty ratio, and ON level setting power for which instructions are given by the controller 100. In a case of a microwave having a single frequency peak, a plurality of waveforms having an ON level in an identical time period illustrated in FIG. 7 become a single waveform centering on the center frequency, and the single waveform repeats ON and OFF.

Signal Waveform Related to ON/OFF of Power

Figure 8A:
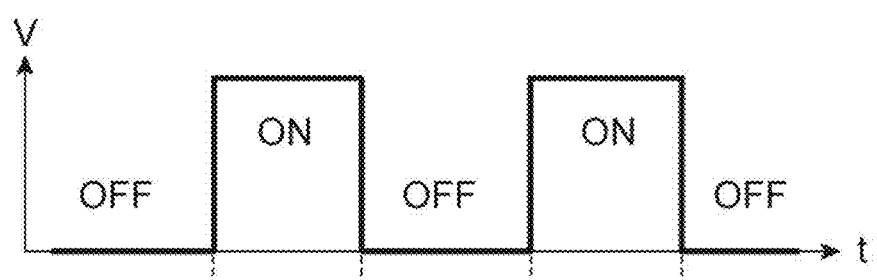
FIGS. 8A to 8D correspond to diagrams illustrating examples of signal waveforms related to ON/OFF control.
Figure 8B:
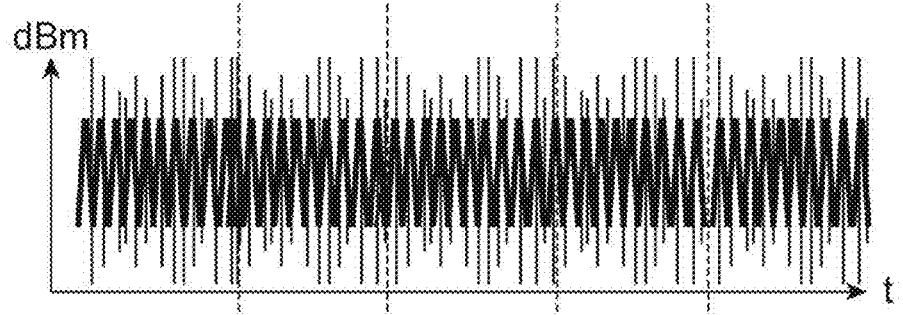
Figure 8C:
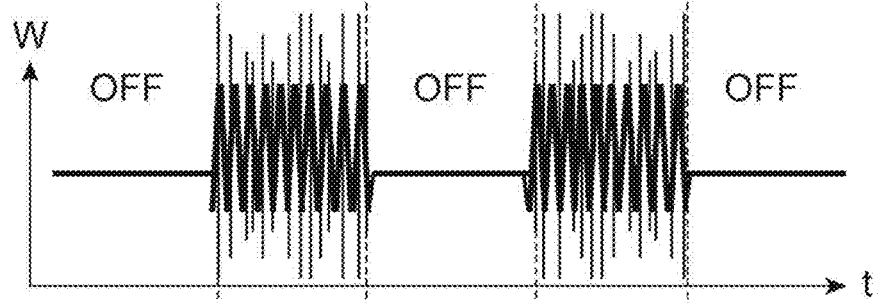
Figure 8D:
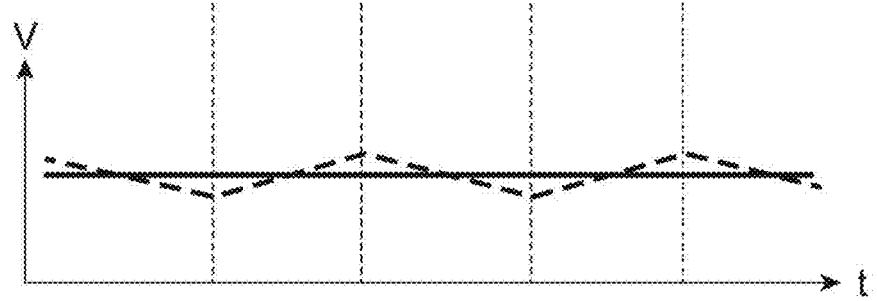

FIGS. 8A to 8D illustrate examples of signal waveforms related to ON/OFF control. A plurality of waveforms illustrated in FIGS. 8A to 8D match each other in timings on a time axis. FIG. 8A illustrates a signal having a waveform of the synchronization signal PSS-M generated by the first pulse generator 102. FIG. 8B illustrates a signal having a waveform of a microwave generated by the waveform generator 101. FIG. 8C illustrates a waveform of a microwave modulated on the basis of the signal in FIG. 8A and the signal in FIG. 8B. FIG. 8D illustrates a signal having a waveform obtained by detecting the signal in FIG. 8C, and illustrates the waveform of the signal which is input to the A/D converter of the measurement unit 16k. In other words, the waveform is a waveform of an averaged analog voltage in the measurement unit 16k. A transverse axis in each drawing expresses time. The signal in FIG. 8B is attenuated on the basis of the signal in FIG. 8A by the power controller 162 and the attenuator 163. For example, the signal in FIG. 8B is attenuated to 0 W in an OFF time of the synchronization signal PSS-M. The attenuated signal is amplified by the amplifier 164 and the amplifier 165 to become the signal in FIG. 8C. The signal in FIG. 8C is amplified such that power in an ON state is setting power Pset. The ON state of the signal in FIG. 8C matches an ON time of the synchronization signal PSS-M appearing in the signal in FIG. 8A. In a case where the signal in FIG. 8C is detected, the waveform of the averaged signal in FIG. 8D is obtained. The signal in FIG. 8D is converted into a digital signal by the A/D converter, and is then converted into power by the CPU. The power is a measured value of power in the measurement unit 16k during ON/OFF control.

Accuracy of Power

Figure 9:
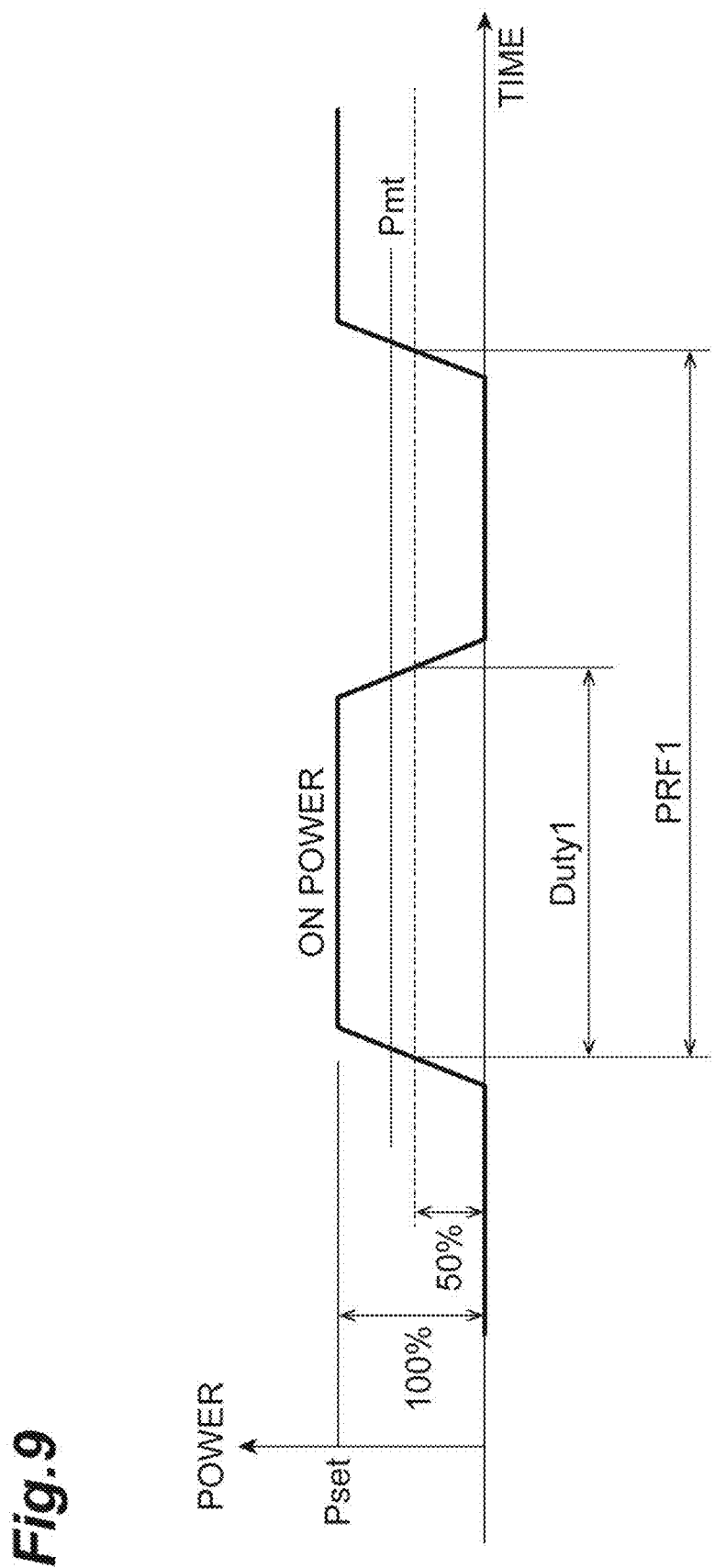
FIG. 9 is a diagram illustrating an example of definition of accuracy of power.

Each average power level of continuous microwaves having a single frequency peak is used as a reference of the accuracy of power. In a case where a microwave is subjected to ON/OFF control, the accuracy of power is defined as follows. FIG. 9 is a diagram illustrating an example of definition of the accuracy of power. FIG. 9 illustrates a waveform of power of a microwave subjected to ON/OFF control. Herein, as an example, a duty ratio Duty1 and a pulse frequency PRF1 are determined by using power corresponding to 50% of the setting power Pset. In other words, a power portion equal to or more than 50% of the setting power Pset is ON power. 50% is a predetermined value, and other values may be used.

In a case where average power which is a measured value in the power meter 181 is indicated by Pmt, ON power Pon is expressed by the following Equation (1).

$$Pon = \frac{Pmt}{Duty1} \times 100 \quad (1)$$

Here, the accuracy of power is evaluated by a difference between ON power and setting power. For example, the accuracy of power E is expressed by the following Equation (2).

$$E = \frac{Pon - Pset}{Pset} \times 100 \quad (2)$$

As is clear from Equation (2), it can be said that the accuracy of power increases as the magnitude of the accuracy of power E becomes closer to 0.

Details of Method

In the method MT1 illustrated in FIG. 1, the accuracy of power E is evaluated by using a measured value in the power meter 181, and a correction value for power is determined such that the accuracy of power E becomes 0. Details of the method MT1 will be described by exemplifying a case where the method MT1 is executed by using the plasma processing apparatus 1. Hereinafter, a correction value for travelling wave power of a microwave will be described, but a correction value for reflected wave power may be acquired in the same method.

First, a description will be made of the method MT1 related to a microwave having a single frequency peak.

As illustrated in FIG. 1, the method MT1 includes a measurement step (step S10), an approximation step (step S12), and a determination step (step S14).

First, the measurement step (step S10) is executed. In the measurement step (step S10), a pulse setting duty ratio is set to a first setting duty ratio which is defined in advance. The first setting duty ratio is a value set in advance on the basis of experiments. As an example, the first setting duty ratio is 20% or more. The first setting duty ratio may be set in a range of 10% to 30%. A specific example of the first setting duty ratio is 20%. Next, at least two setting power levels of a microwave subjected to ON/OFF control at the first setting duty ratio are determined. For example, as the setting power, at least two power levels equal to or more than 1000 W are determined. The setting power may be plural, for example, two such as 1000 W and 2500 W, or four such as 1000 W, 1500 W, 2000 W, and 2500 W.

The microwave generator 16a outputs a microwave subjected to ON/OFF control at the first setting duty ratio, and controls power of the microwave such that power measured by the measurement unit 16k becomes the setting power. Simultaneously, average power of the microwave is measured by using the power meter 181. In the measurement step (step S10), regarding the determined setting power levels, a measured value in the power meter 181 is obtained for each setting power level. An error of the measured value of the power with respect to the setting power level is calculated for each setting power level. In a case where there is no error in the measurement unit 16k as in the above Equation (2), the ON power Pon based on the average power Pmt which is a measured value in the power meter 181 matches the setting power Pset, and thus the accuracy of power E is 0. On the other hand, in a case where there is an error in the measurement unit 16k, the ON power Pon based on the average power Pmt which is a measured value in the power meter 181 does not match the setting power Pset, and thus the accuracy of power E has a value.

Next, the approximation step (step S12) is executed. In the approximation step (step S12), a correction value for power is calculated for each setting power level on the basis of the error. The correction value may be obtained, for example, by inverting a sign of an error of a measured value for power. A relationship between the setting power and the correction value is logarithmically approximated. In other words, a correction value for each setting power level obtained through the measurement is approximated with a function which depends on the setting power, and is thus generalized for the entire setting power range. Consequently, a first function indicating a relationship between the setting power and the correction value at the first setting duty ratio is determined. A first function Y1 at the first setting duty ratio may be expressed by the following Equation (3).

$$Y1 = A \cdot Ln\ (Pset) + B \quad (3)$$

A and B are constants defined through approximation.

Next, the determination step (step S14) is executed. In the determination step (step S14), the correction value at the first setting duty ratio, defined by the first function Y1, and a predefined correction value at a setting duty ratio of 100% are approximated with a linear function. The predefined correction value at the setting duty ratio of 100% is, for example, 0. For example, in a case where the first setting duty ratio is 20%, and a correction value is y1, the correction values are approximated with a straight line connecting a coordinate point (20,y1) to a coordinate point (100,0). In other words, a correction value at the first setting duty ratio is approximated with a function which depends on a setting duty ratio, and is thus generalized for the entire setting duty ratio range. Consequently, a correction function indicating a relationship among a setting duty ratio Duty, the setting power Pset, and a correction value Z1 is determined. In a case where the first setting duty ratio is indicated by DutyA, a correction function indicating the correction value Z1 may be expressed by the following Equation (4).

$$Z1 = Y1 \cdot \frac{Duty - 100}{DutyA - 100} = \frac{(A \cdot \text{Ln}(Pset) + B) \cdot (Duty - 100)}{DutyA - 100} \quad (4)$$

In a case where the determination step (step S14) is finished, the flowchart of FIG. 1 is finished.

As mentioned above, the flowchart of FIG. 1 is executed, and thus the correction function indicating the correction value Z1 may be determined. By using the correction function, a correction value for any setting duty ratio and any setting power can be determined.

There is a case where generalization to a linear function in a range less than the first setting duty ratio is not appropriate. Thus, the correction function may be a function for determining a correction value at a duty ratio equal to or higher than the first setting duty ratio. In other words, Equation (4) may be an equation established in a range satisfying DutyA <=Duty. In this case, in the determination step, a correction function at the first setting duty ratio or less may be separately determined. For example, a correction value at the first setting duty ratio or less may be a constant.

The flowchart may be applied to reflected wave power. In other words, correction values for travelling wave power and reflected wave power may be acquired by using the method MT1.

Next, a description will be made of a method related to a microwave having a bandwidth. A correction function for a microwave having a bandwidth may be determined in the same method as the method MT1 related to a microwave having a single frequency peak. A separate method related to a microwave having a bandwidth is a method of revising a correction function obtained according to the method MT1. Consequently, a correction function can be easily determined. Hereinafter, as a method MT2 related to a microwave having a bandwidth, a description will be made of a method of revising a correction function acquired according to the method MT1. Hereinafter, a mode (an example of a first mode) in which a microwave having a single frequency peak is generated will be described as a single peak mode (SP mode). A mode in which a microwave having a bandwidth is generated will be described as a broadband mode (BB mode).

Figure 10:
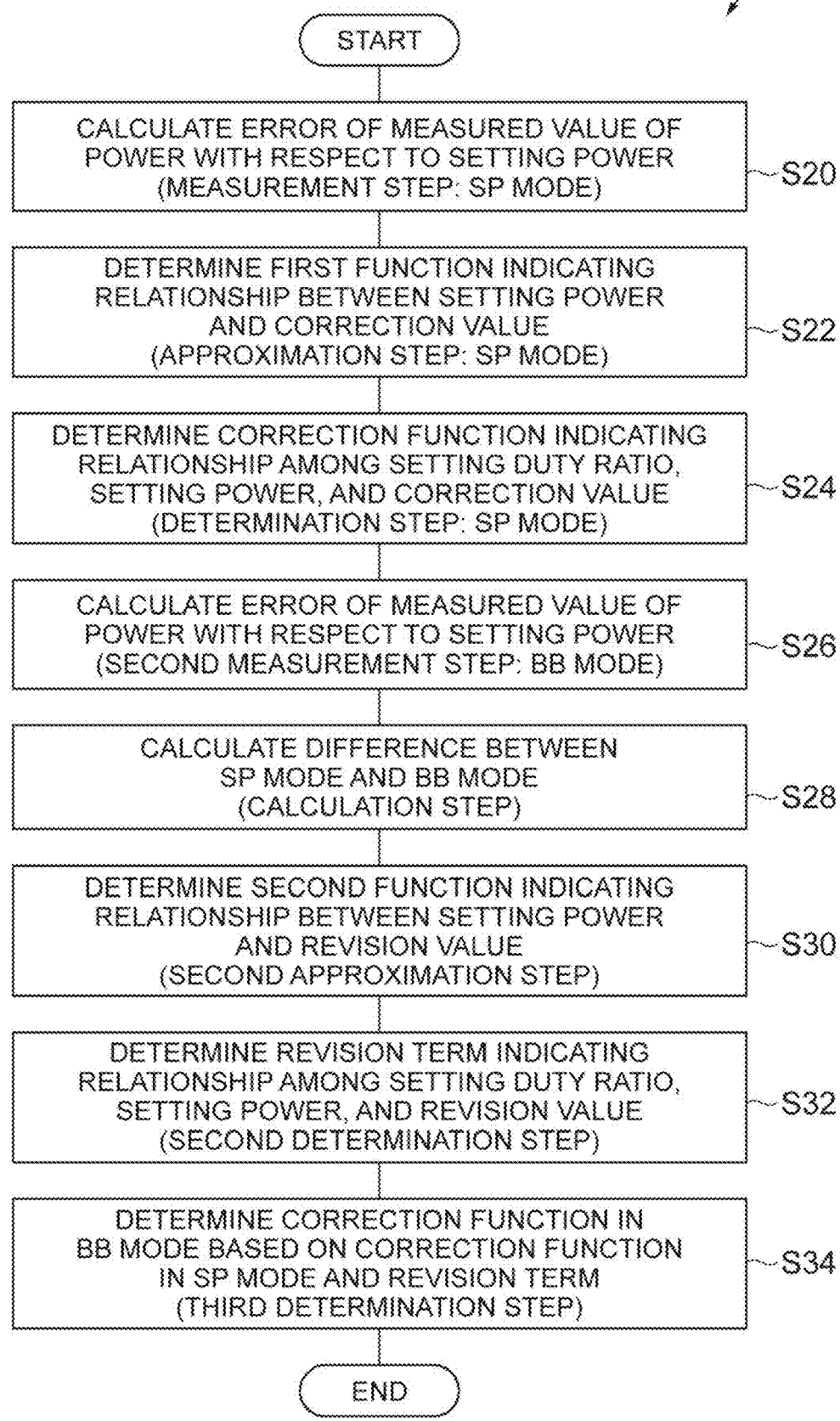
FIG. 10 is a flowchart illustrating an example of another method according to the embodiment.

FIG. 10 is a flowchart illustrating an example of another method according to the embodiment. As illustrated in FIG. 10, the method MT2 includes a measurement step (step S20), an approximation step (step S22), and a determination step (step S24). The steps are performed by using a microwave in the SP mode, and are the same as the measurement step (step S10), the approximation step (step S12), and the determination step (step S14) in the method MT1. Through the steps, the correction function Z1 may be obtained.

Next, a second measurement step (step S26) is executed by using a microwave in the BB mode. In the second measurement step (step S26), a pulse setting duty ratio is set to a predefined second setting duty ratio in the same manner as in the measurement step (step S20). The second setting duty ratio is a value set in advance on the basis of experiments. As an example, the second setting duty ratio is 10% or more. The second setting duty ratio may be set in a range of 5% to 30%. A specific example of the second setting duty ratio is 10%. Next, at least two setting power levels of a microwave subjected to ON/OFF control at the second setting duty ratio are determined. For example, as the setting power, at least two power levels equal to or more than 1000 W are determined. The setting power may be plural, for example, two such as 1000 W and 2500 W, or four such as 1000 W, 1500 W, 2000 W, and 2500 W.

The microwave generator 16a outputs a microwave subjected to ON/OFF control at the second setting duty ratio, and controls power of the microwave such that power measured by the measurement unit 16k becomes the setting power. Simultaneously, average power of the microwave is measured by using the power meter 181. In the second measurement step (step S26), regarding the determined setting power levels, a measured value in the power meter 181 is obtained for each setting power level. An error of the measured value of the power with respect to the setting power level is calculated for each setting power level.

Next, a calculation step (step S28) is executed. In the calculation step (step S28), a difference between an error applied to the microwave in the SP mode and an error applied to the microwave in the BB mode is calculated for setting power level. In other words, a difference between the error of power obtained in the measurement step (step S20) and the error of power obtained in the measurement step (step S26) is calculated. A difference between the error in the SP mode obtained by using the correction function Z1 and the error of power obtained in the measurement step (step S26) may be calculated.

Next, a second approximation step (step S30) is executed. In the second approximation step (step S30), first, a revision value for revising a correction value in the SP mode to a correction value in the BB mode is calculated. The revision value is calculated for each setting power level on the basis of the difference obtained in the calculation step (step S28). A relationship between the setting power and the revision value is logarithmically approximated. In other words, a revision value for each setting power level obtained through the measurement is approximated with a function which depends on the setting power, and is thus generalized for the entire setting power range. Consequently, a second function Y2 indicating a relationship between the setting power and the revision value at the first setting duty ratio is determined. The second function Y2 at the first setting duty ratio may be expressed by the following Equation (5).

$$Y2 = C \cdot \text{Ln}(Pset) + D \quad (5)$$

C and D are constants defined through approximation.

Next, a second determination step (step S32) is executed. In the second determination step (step S32), the revision value at the first setting duty ratio, defined by the second function Y2, and a predefined revision value at a setting duty ratio of 100% are approximated with a linear function. The predefined revision value at the setting duty ratio of 100% is, for example, 0. For example, in a case where the first setting duty ratio is 20%, and a revision value is y2, the revision values are approximated with a straight line connecting a coordinate point (20,y2) to a coordinate point (100,0). In other words, a revision value at the first setting duty ratio is approximated with a function which depends on a setting duty ratio, and is thus generalized for the entire setting duty ratio range. Consequently, a revision term indicating a relationship among the setting duty ratio Duty, the setting power Pset, and a revision value K is determined. In a case where the second setting duty ratio is indicated by DutyB, a revision term indicating the revision value K may be expressed by the following Equation (6).

$$K = Y2 \cdot \frac{Duty - 100}{DutyB - 100} = \frac{(C \cdot \text{Ln}(Pset) + D) \cdot (Duty - 100)}{DutyB - 100} \quad (6)$$

Next, a third determination step (step S34) is executed. In the third determination step (step S34), a correction function Z2 applied to the microwave having the bandwidth is determined on the basis of the revision term indicating the revision value K and the correction function Z1 applied to the microwave in the SP mode. The correction function Z2 may be expressed by the following Equation (7).

$$Z2 = Z1 + K = \frac{(A \cdot \text{Ln}(Pset) + B) \cdot (Duty - 100)}{DutyA - 100} + \frac{(C \cdot \text{Ln}(Pset) + D) \cdot (Duty - 100)}{DutyB - 100} \quad (7)$$

In a case where the third determination step (step S34) is finished, the flowchart of FIG. 10 is finished.

As mentioned above, the flowchart of FIG. 10 is executed, and thus a correction function indicating the correction value Z2 can be determined. By using the correction function, a correction value for any setting duty ratio and any setting power can be determined.

There is a case where generalization to a linear function in a range less than the second setting duty ratio is not appropriate. Thus, the correction function may be a function for determining a correction value at a duty ratio equal to or higher than the second setting duty ratio. In other words, Equation (7) may be an equation established in a range satisfying DutyA <=Duty and DutyB <=Duty. In this case, in the third determination step, a correction function at the second setting duty ratio or less may be separately determined. For example, a correction value at the second setting duty ratio or less may be a constant.

The flowchart may be applied to reflected wave power. In other words, correction values for travelling wave power and reflected wave power may be acquired by using the method MT2.

Summary of Embodiment Related to Methods

According to the methods MT1 and MT2 of the embodiment, if errors of at least two measured power levels have only to be measured, the correction functions Z1 and Z2 for correcting errors of power in any process condition can be determined. Therefore, according to the method, it is possible to easily determine a correction value compared with a method of determining a correction value through comparison with power measured by a calibration measuring device with respect to all process conditions. Thus, it is possible to alleviate calibration work during product shipment.

Example of Microwave Output Device Operated by Using Correction Function

Figure 11:
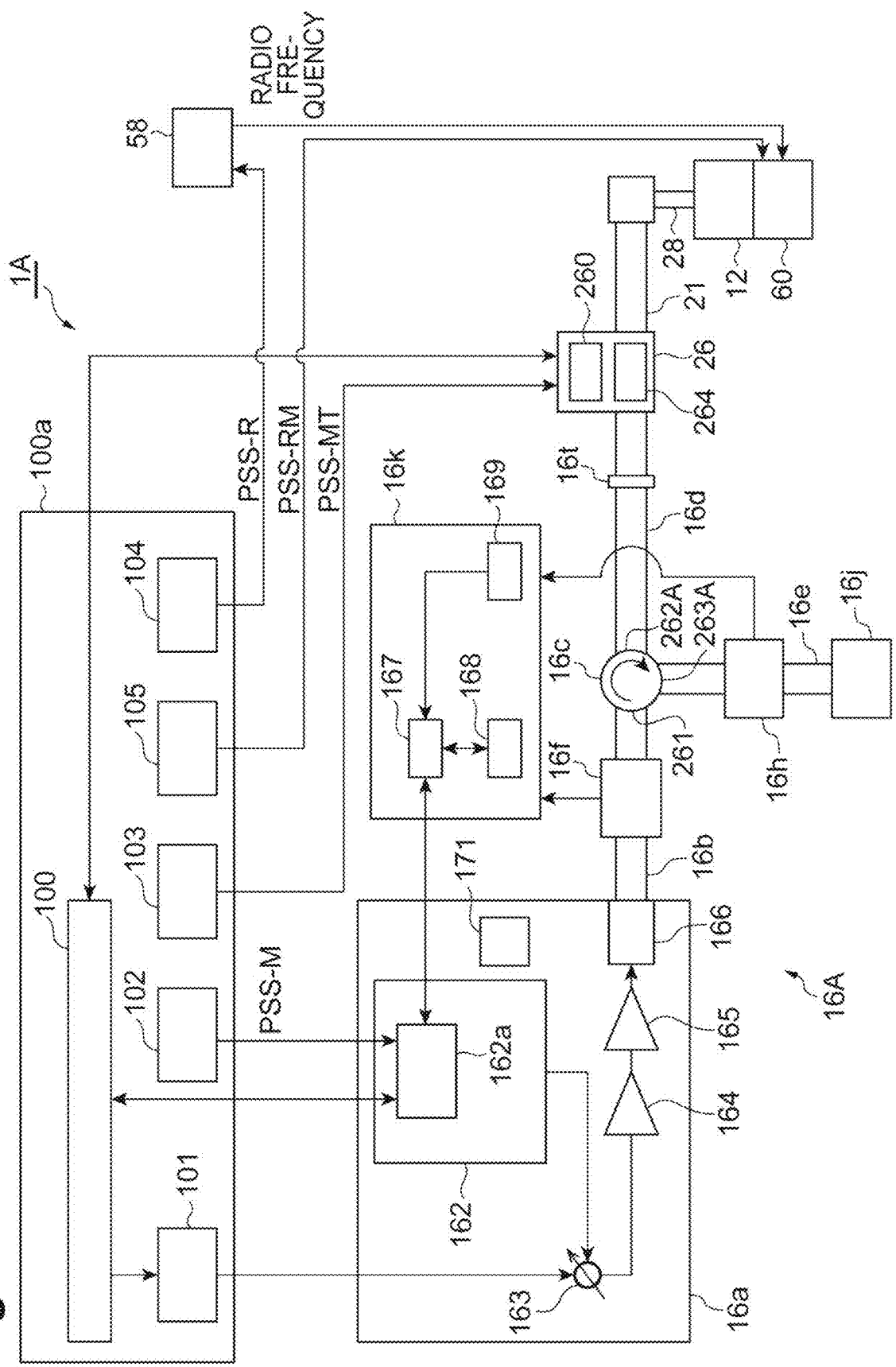
FIG. 11 is a diagram illustrating an example of a microwave output device which is operated by using a determined correction value.

FIG. 11 is a diagram illustrating an example of a microwave output device which is operated by using a determined correction value. A microwave output device 16A illustrated in FIG. 11 is the same as the microwave output device 16 in FIG. 3 except that a storage unit 171 is provided, and some functions of the power controller 162 are different. Hereinafter, differences will be focused, and overlapping description will not be repeated.

As illustrated in FIG. 11, a plasma processing apparatus 1A includes the storage unit 171. The storage unit 171 stores a correction function indicating a relationship among a setting duty ratio, setting power, and a correction value, for each mode. In other words, a correction function for the SP mode and a correction function for the BB mode are stored. The power controller 162 of the microwave generator 16a acquires a setting mode, a setting duty ratio, and setting power for which instructions are given by the controller 100. The power controller 162 refers to the storage unit 171, and reads a correction function on the basis of the setting mode. The power controller 162 obtains a correction value corresponding to the setting duty ratio and the setting power by using the correction function. The power controller 162 corrects a measurement result of power of a microwave in the measurement unit 16k on the basis of the correction value, and generates a microwave such that the corrected measurement result becomes the setting power.

As mentioned above, the correction functions are held in the storage unit 171, and thus it is possible to acquire a correction value corresponding to any mode, any setting duty ratio, and any setting power.

As mentioned above, various embodiments have been described, but the present disclosure is not limited to the embodiments, and may be variously modified.

In the embodiments, a description has been made of an example in which the microwave generator 16a and the waveform generator 101 are separately configured, but the microwave generator 16a and the waveform generator 101 may be configured as a single device. A description has been made of an example in which the calculation device 100a includes the first pulse generator 102 to the fourth pulse generator 105, but this is only an example. For example, the power controller 162 may include the first pulse generator 102.

The methods MT1 and MT2 may be automatically executed by the calculation device 100a.

The storage unit 171 may be provided in the measurement unit 16k. In this case, a power measurement result may be corrected by the CPU of the measurement unit 16k.

EXAMPLES

Hereinafter, simulation results for describing effects of the present disclosure will be described.

Determination of First Setting Duty Ratio

A description will be made of simulation for determining the first setting duty ratio. As simulation conditions, a microwave in the SP mode was used, and the setting power Pset was 1000 W, 1500 W, 2000 W, and 2500 W. A pulse modulation method was ON/OFF modulation. A setting duty ratio for pulse modulation was 10%, 15%, 20%, 25%, 30%, 40%, 50%, 70%, 90%, and 100%. A setting pulse frequency was 5 kHz, 10 kHz, and 20 kHz. The setting duty ratio was changed in the range of 10% to 100% for each of the setting pulse frequencies, and power accuracy was calculated. The power accuracy was calculated by using Equation (2). Results thereof are shown in FIGS. 12A to 12D.

Figure 12A:
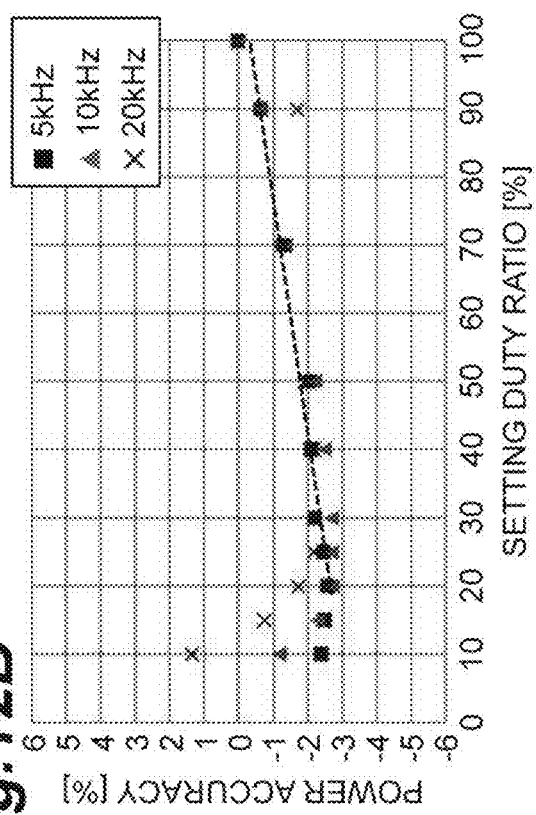
FIGS. 12A to 12D are diagrams illustrating simulation results of a relationship between a setting duty ratio and power accuracy of a microwave having a single frequency peak.
Figure 12B:
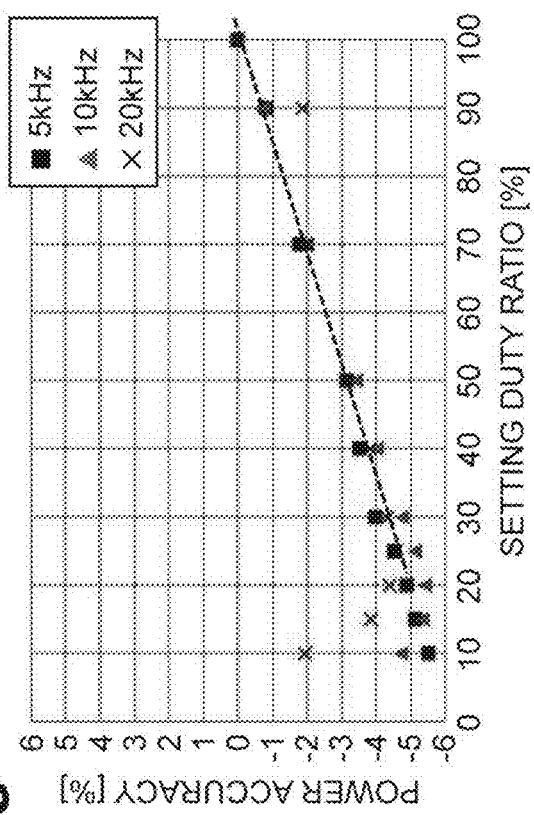
Figure 12C:
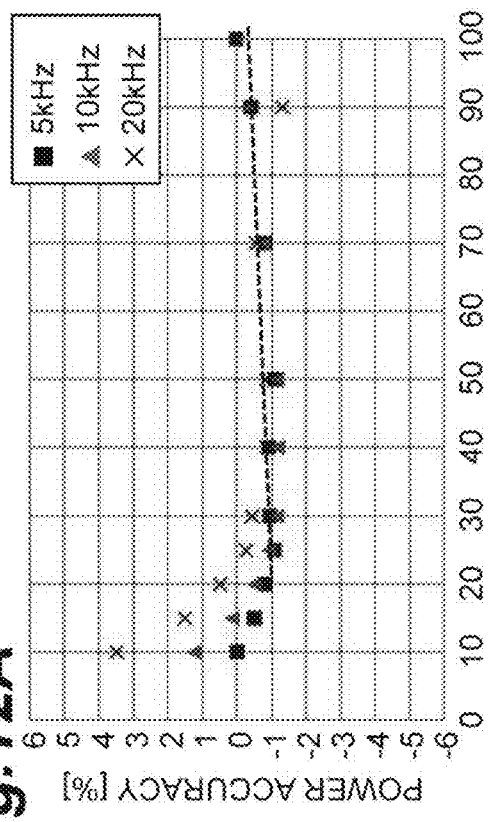
Figure 12D:
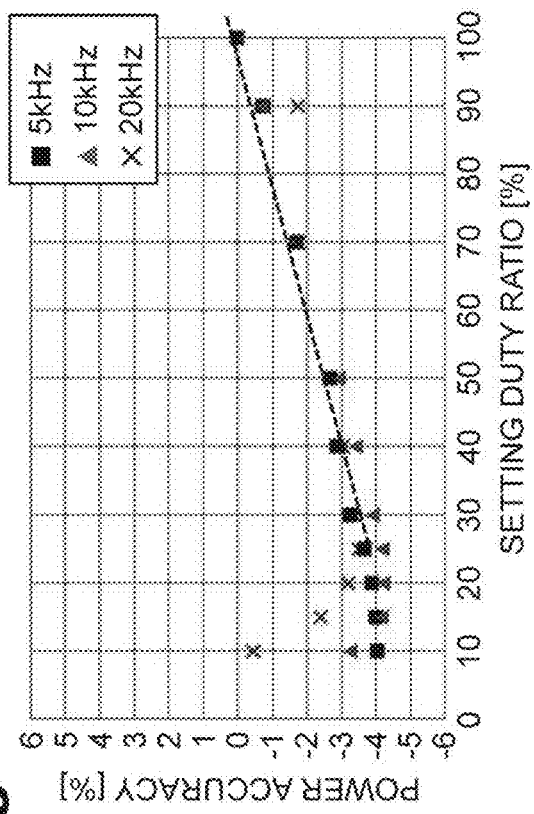

FIGS. 12A to 12D illustrate results of simulating a relationship between a setting duty ratio and power accuracy of a microwave having a single frequency peak. A transverse axis expresses a setting duty ratio [%], and a longitudinal axis expresses power accuracy [%]. In FIGS. 12A to 12D, a relationship between a setting duty ratio and power accuracy of a microwave was simulated for each of the pulse frequencies of 5 kHz, 10 kHz, and 20 kHz. FIG. 12A is a graph illustrating a result in a case where the setting power was 1000 W. FIG. 12B is a graph illustrating a result in a case where the setting power was 1500 W. FIG. 12C is a graph illustrating a result in a case where the setting power was 2000 W. FIG. 12D is a graph illustrating a result in a case where the setting power was 2500 W.

As illustrated in FIGS. 12A to 12D, it was checked that the power accuracy with respect to a duty ratio linearly changes in the range of the setting duty ratio of 20% to 100% in either condition of a pulse frequency and setting power (dashed straight lines in the figures). In a case of 10% and 15% lower than 20%, it was checked that there is a tendency that the power accuracy nonlinearly changes, and the tendency becomes more noticeable as the setting pulse frequency becomes higher. Thus, it was checked that the first setting duty ratio is preferably set to 20% or more.

Example of Determination of Correction Function in Method MT1

The first setting duty ratio was 20%, the setting pulse frequency was 5 kHz, an error of each power level in the pulse condition was measured, and a correction value was calculated by using the error. As simulation conditions, a microwave in the SP mode was used, and the setting power Pset was 1000 W, 1500 W, 2000 W, and 2500 W. A pulse modulation method was ON/OFF modulation. Results thereof are shown in FIGS. 13A and 13B.

Figure 13A:
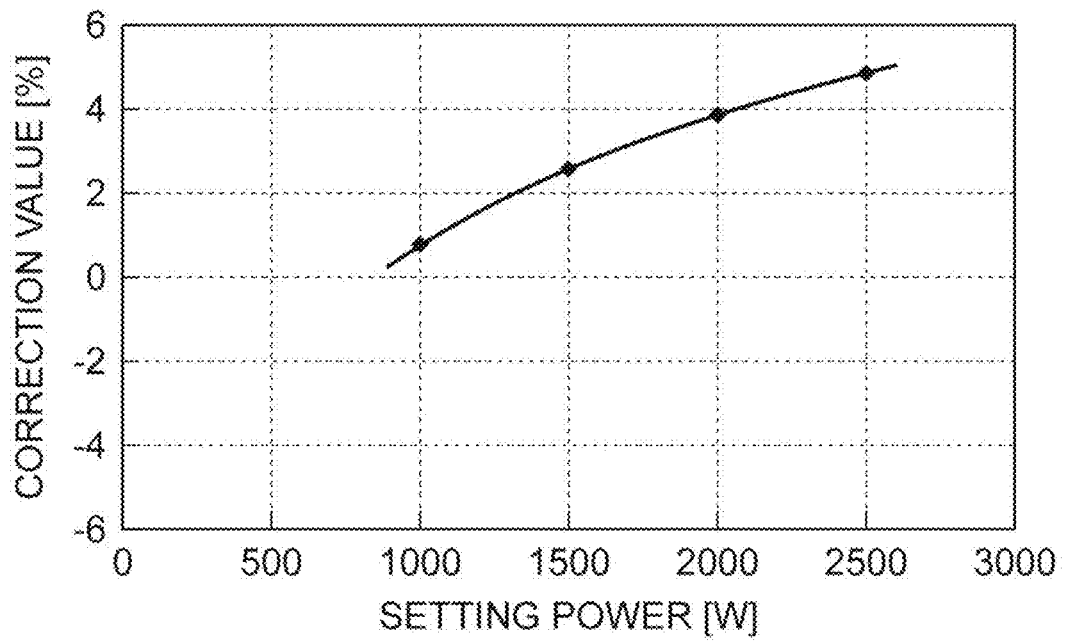
FIGS. 13A and 13B are diagrams illustrating simulation results of determining a correction function applied to the microwave having the single frequency peak.
Figure 13B:
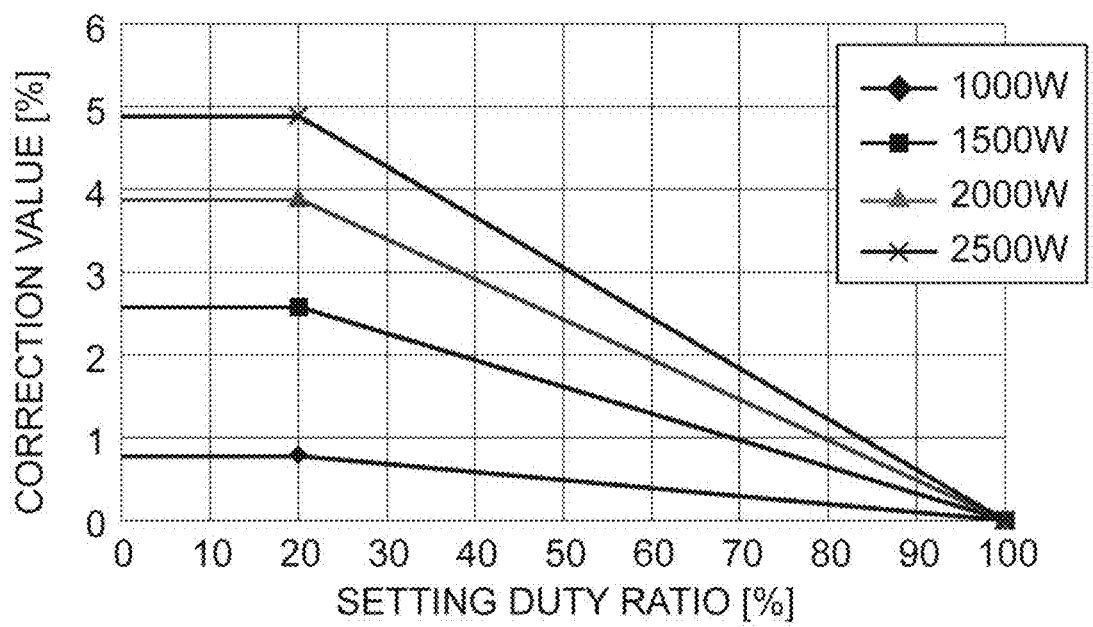

FIGS. 13A and 13B illustrate simulation results of determining a correction function applied to a microwave having a single frequency peak. FIG. 13A is a graph illustrating a relationship between setting power and a correction value. A transverse axis expresses setting power [%], and a longitudinal axis expresses a correction value [%]. As illustrated in FIG. 13A, correction values at 1000 W, 1500 W, 2000 W, and 2500 W were approximated by using the logarithmic function shown in Equation (3). Consequently, the constants A and B were determined, and a curve (first function Y1) in the figure was obtained.

FIG. 13B is a graph illustrating a relationship between a setting duty ratio and a correction value. A transverse axis expresses a setting duty ratio [%], and a longitudinal axis expresses a correction value [%]. As illustrated in FIG. 13B, two points such as a point formed by the first setting duty ratio of 20% and a correction value (a correction value obtained by using the first function Y1) corresponding thereto and a point formed by the setting duty ratio of 100% and the correction value of 0 corresponding thereto were linearly approximated. Consequently, the correction function Z1 shown in Equation (4) was obtained. The linear approximation may be performed at any of 1000 W, 1500 W, 2000 W, and 2500 W. As mentioned above, it was checked that the correction function Z1 can be determined.

Comparison between SP Mode and BB Mode

Prior to determination of a correction function in the BB mode, with respect to a plurality of measurement units $16k$, a difference between measurement of travelling wave power of a microwave in the SP mode and measurement of travelling wave power of a microwave in the BB mode was checked. As simulation conditions, the setting power Pset was 300 W, 500 W, 1000 W, 1500 W, 2000 W, 2500 W, and 3000 W. A pulse modulation method was ON/OFF modulation. A setting duty ratio for pulse modulation was 10%, 50%, 90%, and 100% (continuous wave). The setting pulse frequency was 20 kHz. Three measurement units $16k$ were prepared. The power accuracy with respect to setting power was calculated for each setting duty ratio in each measurement unit $16k$. An average value and a variation of the power accuracy obtained from the respective three measurement units were checked. Results thereof are shown in FIGS. 14A to 14D.

Figure 14A:
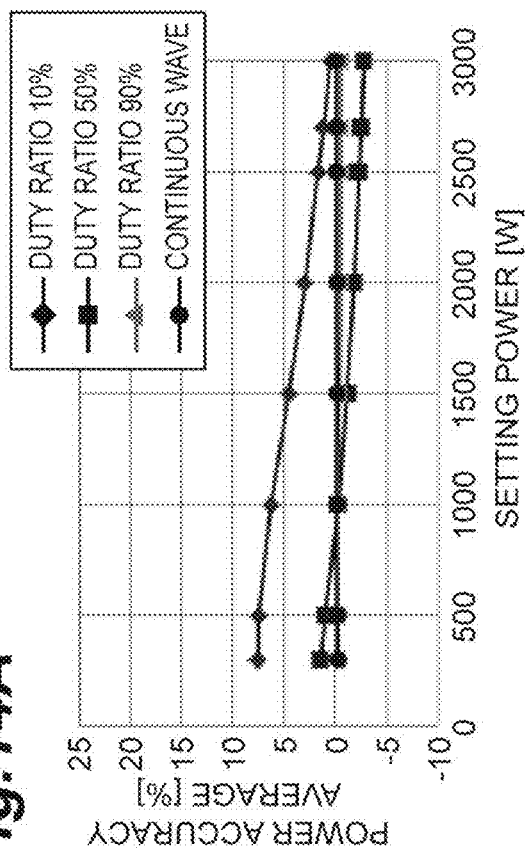
FIGS. 14A to 14D are diagrams illustrating simulation results of power accuracy in the measurement unit.
Figure 14B:
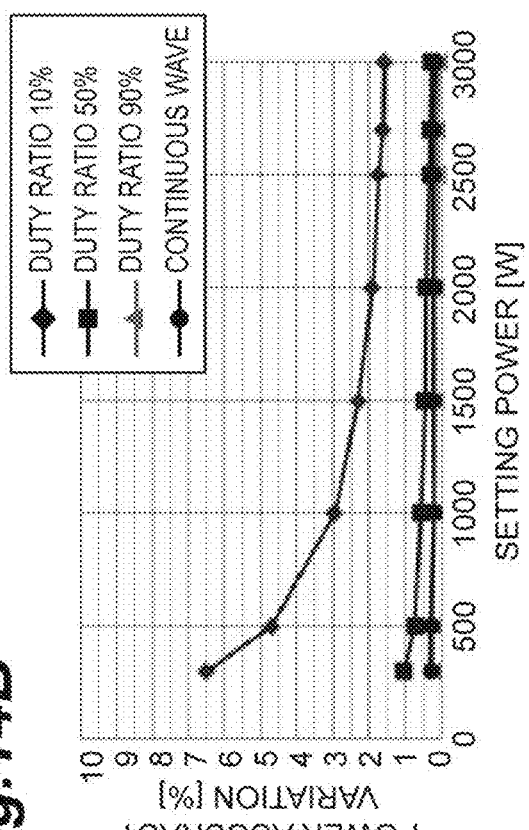
Figure 14C:
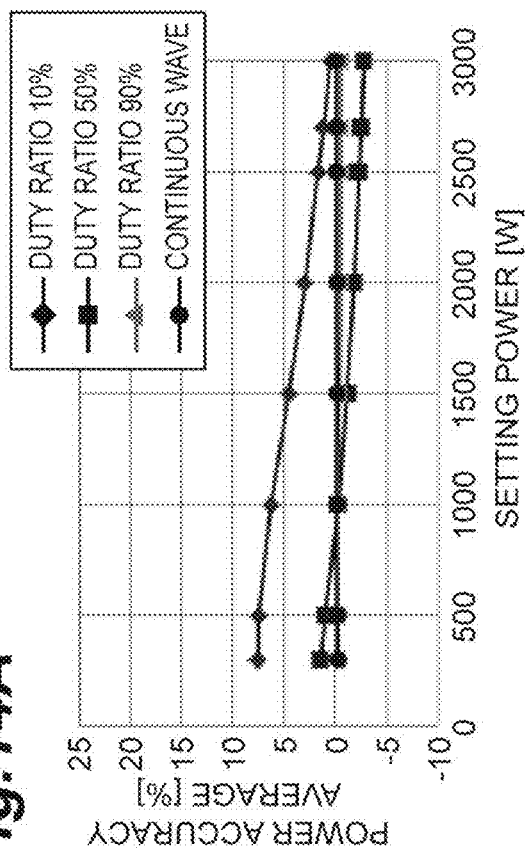
Figure 14D:
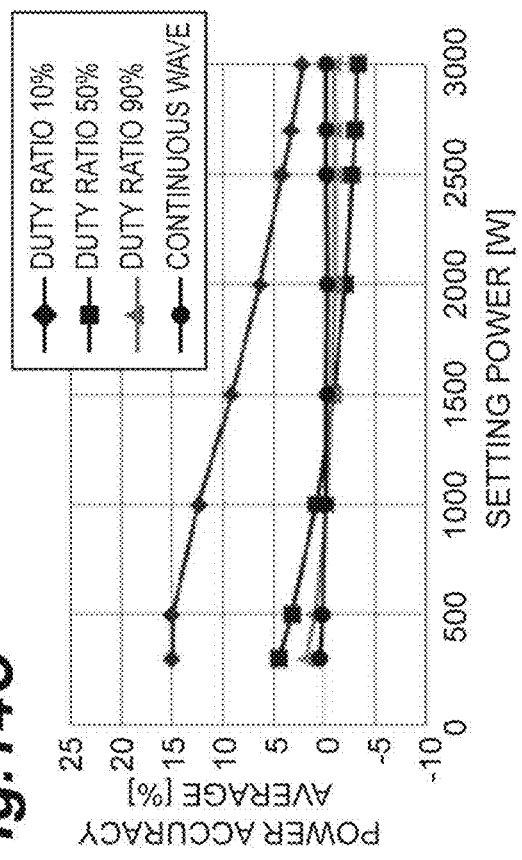

FIGS. 14A to 14D illustrate simulation results of the power accuracy in the measurement unit. FIGS. 14A and 14B illustrate results in the SP mode. In FIG. 14A, a transverse axis expresses setting power [W], and a longitudinal axis expresses a power accuracy average [%]. In FIG. 14B, a transverse axis expresses setting power [W], and a longitudinal axis expresses a power accuracy variation [%]. FIGS. 14C and 14D illustrate results in the BB mode. In FIG. 14C, a transverse axis expresses setting power [W], and a longitudinal axis expresses a power accuracy average [%]. In FIG. 14D, a transverse axis expresses setting power [W], and a longitudinal axis expresses a power accuracy variation [%].

Through comparison between FIGS. 14A and 14C, it was checked that the power accuracy average related to the BB mode is lower in terms of accuracy than the power accuracy average related to the SP mode. It was checked that the accuracy average is reduced as a duty ratio becomes lower. Through comparison between FIGS. 14B and 14D, it was checked that the power accuracy variation related to the BB mode is reduced as a duty ratio becomes lower, compared with the power accuracy variation related to the SP mode. As mentioned above, it was checked that the BB mode has great influence on an error in the measurement unit compared with the SP mode.

Next, a difference between the power accuracy in the SP mode and the power accuracy in the BB mode was checked. As simulation conditions, the setting power Pset was 300 W, 500 W, 1000 W, 1500 W, 2000 W, 2500 W, and 3000 W. A pulse modulation method was ON/OFF modulation. A setting duty ratio for pulse modulation was 10%, 50%, 90%, and 100% (continuous wave). The setting pulse frequency was 10 kHz and 20 kHz. Three measurement units $16k$ were prepared. A power accuracy difference with respect to setting power was calculated for each setting duty ratio in each measurement unit $16k$. An average value and a variation were checked on the basis of power accuracy differences obtained from the respective three measurement units. Results thereof are shown in FIGS. 15A to 15C and FIGS. 16A to 16C.

Figure 15A:
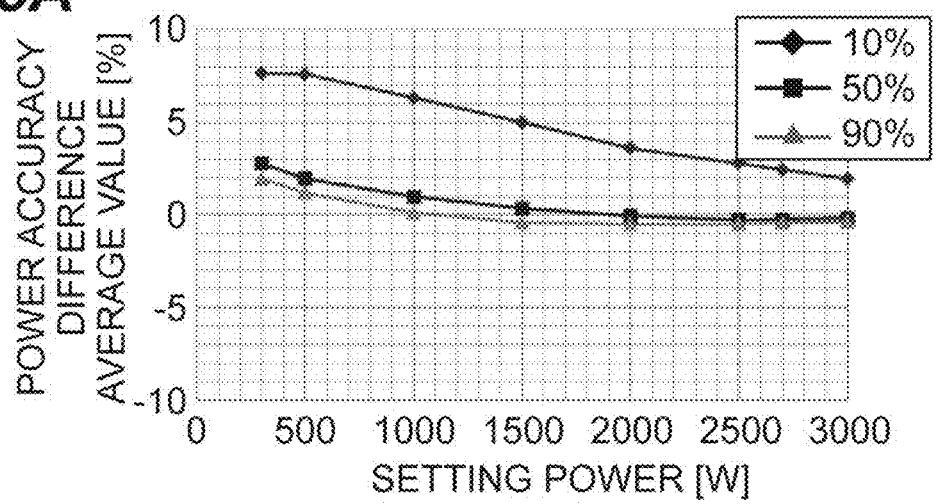
FIGS. 15A to 15C are diagrams illustrating simulation results of an inter-mode power accuracy difference average value.
Figure 15B:
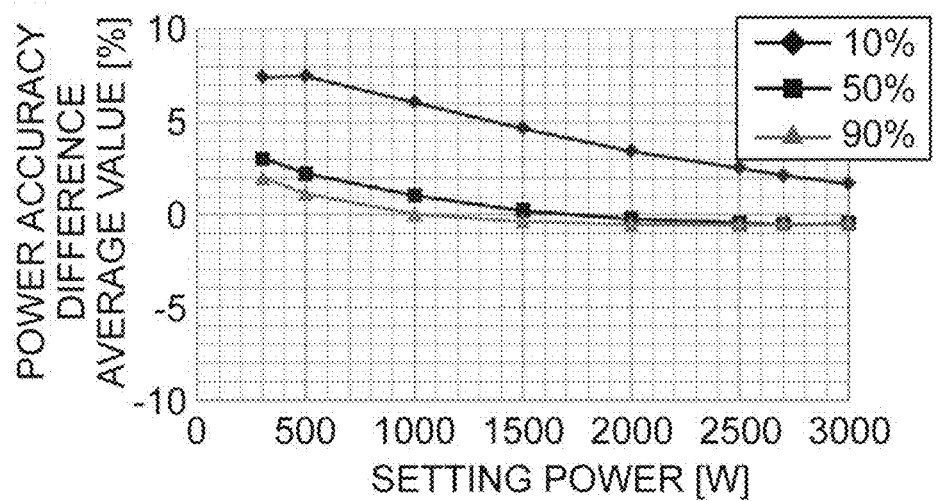
Figure 15C:
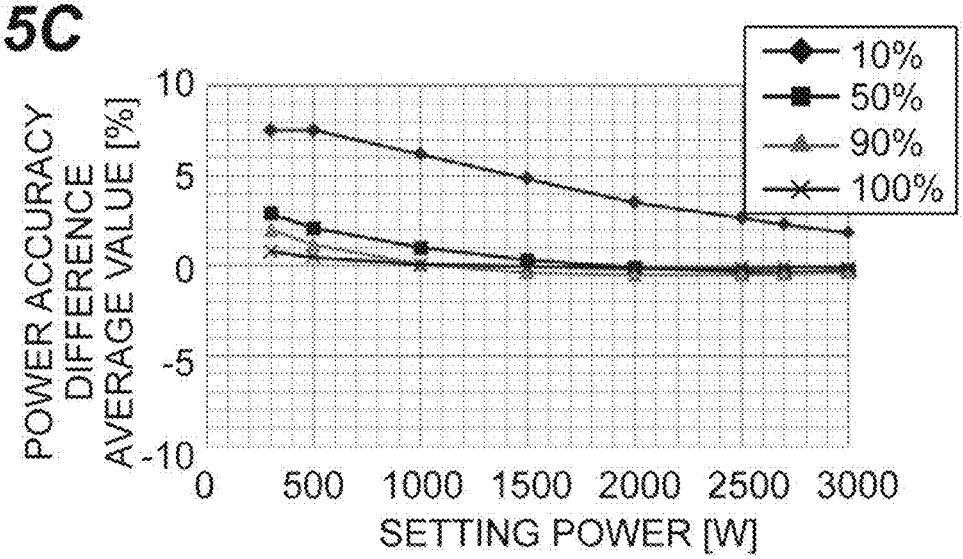

FIGS. 15A to 15C illustrate simulation results of an inter-mode power accuracy difference average value. A transverse axis expresses setting power [W], and a longitudinal axis expresses a power accuracy difference average value [%]. FIG. 15A illustrates a result at the pulse frequency of 10 kHz, FIG. 15B illustrates a result at the pulse frequency of 20 kHz, and FIG. 15C illustrates a result of the pulse frequency of 10 kHz being combined with the pulse frequency of 20 kHz. As illustrated in FIGS. 15A to 15C, it was checked that there is a difference between the power accuracy in the BB mode and the power accuracy in the SP mode.

Figure 16A:
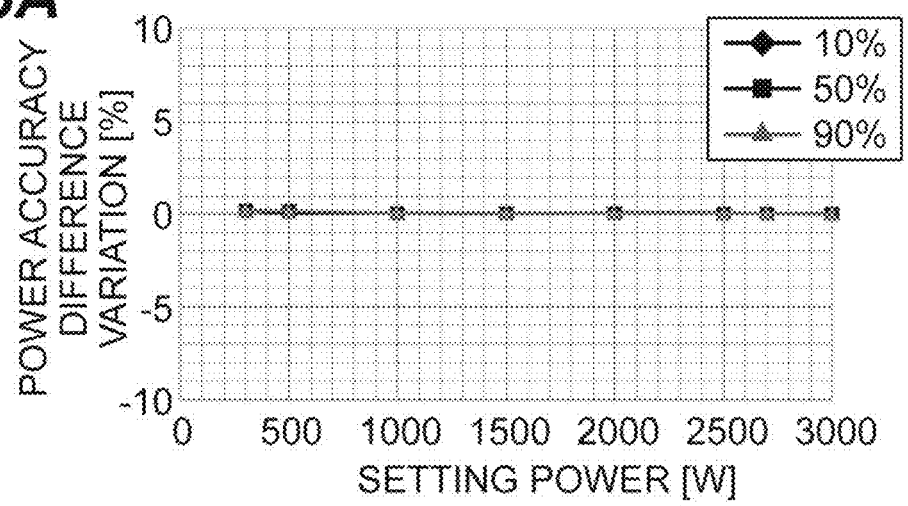
FIGS. 16A to 16C are diagrams illustrating simulation results of an inter-mode power accuracy difference variation.
Figure 16B:
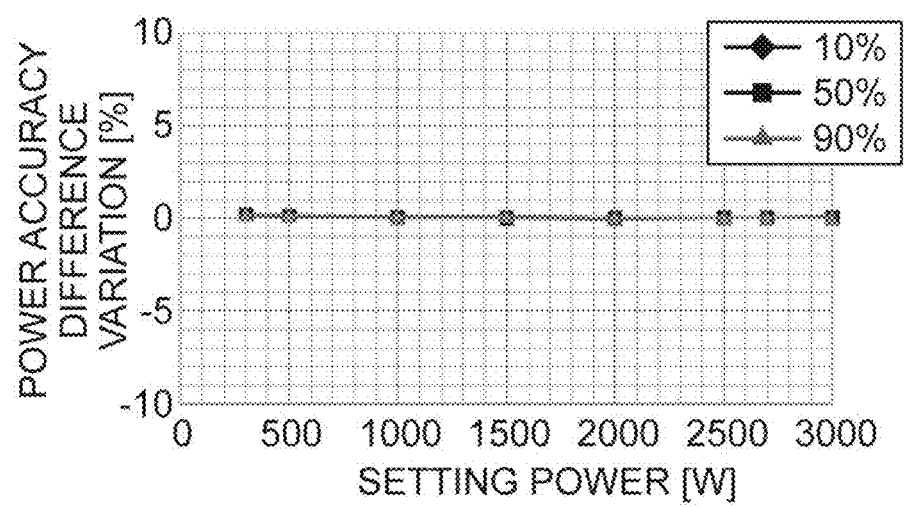
Figure 16C:
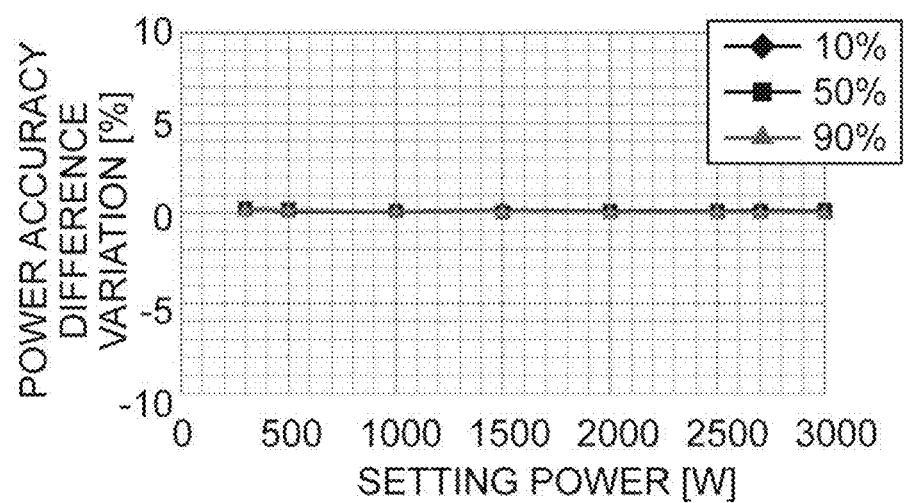

FIGS. 16A to 16C illustrate simulation results of an inter-mode power accuracy difference average value. A transverse axis expresses setting power [W], and a longitudinal axis expresses a power accuracy difference variation [%]. FIG. 16A illustrates a result at the pulse frequency of 10 kHz, FIG. 16B illustrates a result at the pulse frequency of 20 kHz, and FIG. 16C illustrates a result of the pulse frequency of 10 kHz being combined with the pulse frequency of 20 kHz. As illustrated in FIGS. 16A to 16C, it was checked that there is no difference variation between the power accuracy in the BB mode and the power accuracy in the SP mode.

It was checked from FIGS. 15A to 15C and FIGS. 16A to 16C that the power accuracy in the BB mode can be obtained by uniformly correcting the power accuracy in the SP mode. In other words, it was checked that the power accuracy in the BB mode can be obtained according to the technique of the method MT1.

Example of Determination of Correction Function in Method MT2

First, a description will be made of simulation for determining the second setting duty ratio. As simulation conditions, microwaves in the SP mode and the BB mode were used, and the setting power Pset was 1000 W, 1500 W, 2000 W, and 2500 W. A pulse modulation method was ON/OFF modulation. A setting duty ratio for pulse modulation was 10%, 50%, 90%, and 100%. A setting pulse frequency was 5 kHz. The setting duty ratio was changed in the range of 10% to 100% in each mode, and power accuracy was calculated. A power accuracy difference was obtained by subtracting the power accuracy in the SP mode from the power accuracy in the BB mode. Results thereof are shown in FIG. 17A.

Figure 17A:
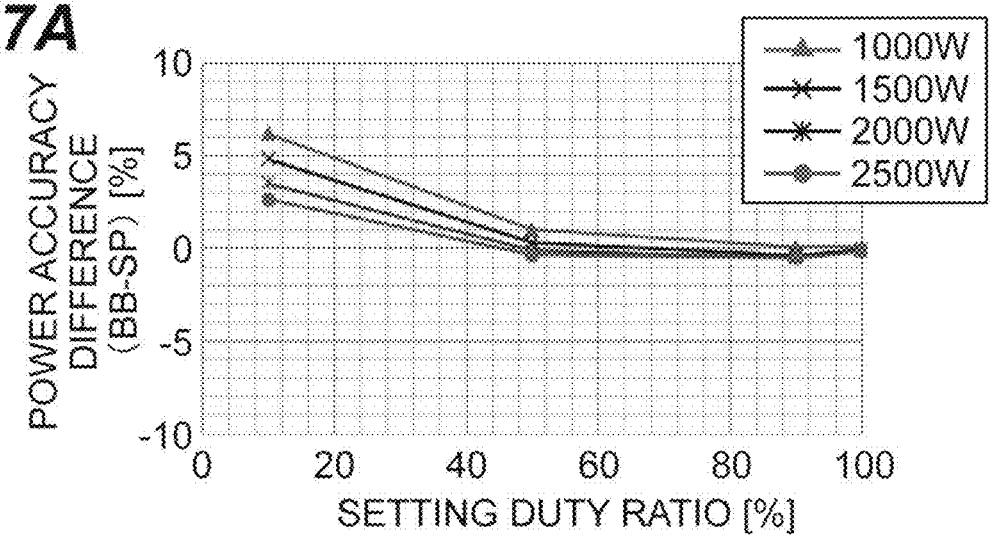
FIGS. 17A to 17C are diagrams illustrating simulation results of determining a correction function applied to a microwave having a bandwidth.
Figure 17B:
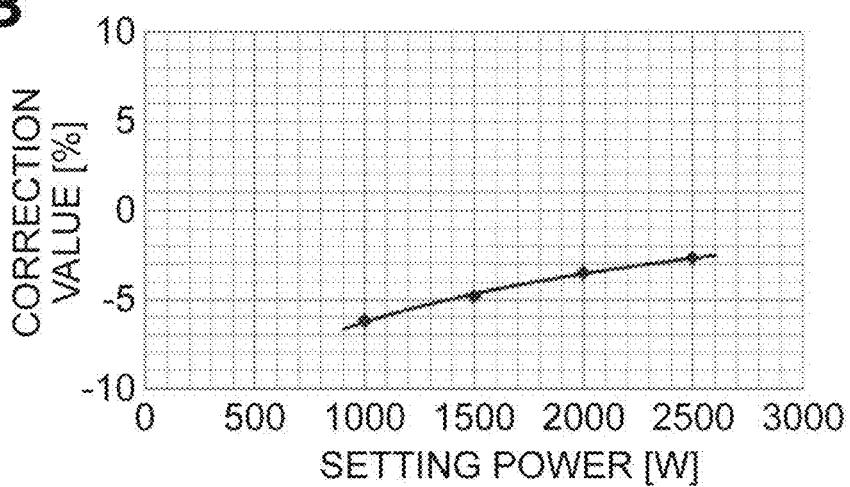
Figure 17C:
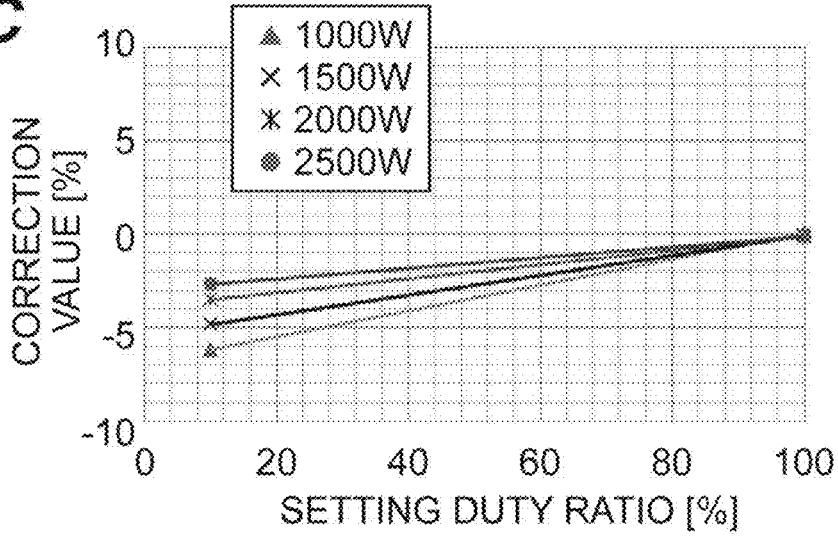

FIGS. 17A to 17C illustrate simulation results of determining a correction function applied to a microwave having a bandwidth. In FIG. 17A, a transverse axis expresses a setting duty ratio [%], and a longitudinal axis expresses a power accuracy difference [%]. In the graph of FIG. 17A, the duty ratio of 10% at which a power accuracy difference differs for each power level is used as the second setting duty ratio.

Next, the result in FIG. 17A at the second setting duty ratio of 10% was subjected to coordinate conversion, and thus a result illustrated in FIG. 17B was obtained. FIG. 17B is a graph illustrating a relationship between setting power and a correction value. In FIG. 17B, a transverse axis expresses setting power [W], and a longitudinal axis expresses a correction value (revision value) [%]. As illustrated in FIG. 17B, correction values at 1000 W, 1500 W, 2000 W, and 2500 W was approximated by using the logarithmic function shown in Equation (5). Consequently, the constants C and D were determined, and a curve (second function Y2) in the figure was obtained.

FIG. 17C is a graph illustrating a relationship between a setting duty ratio and a correction value. A transverse axis expresses a setting duty ratio [%], and a longitudinal axis expresses a correction value (revision value) [%]. As illustrated in FIG. 17C, two points such as a point formed by the second setting duty ratio of 10% and a revision value (a revision value obtained by using the second function Y2) corresponding thereto and a point formed by the setting duty ratio of 100% and the revision value of 0 corresponding thereto were linearly approximated. Consequently, a revision term indicating the revision value K shown in Equation (6) was obtained. The linear approximation may be performed at any of 1000 W, 1500 W, 2000 W, and 2500 W. As mentioned above, it was checked that a revision term can be determined.

What is claimed is:

1. A method of determining a correction function for correcting an error in a wave detector in a microwave output device measuring, by using the wave detector, power of a microwave which is output from a microwave generator and is pulse-modulated and controlling the microwave generator such that a measurement result matches setting power, the method comprising:
    setting a setting duty ratio of a pulse to a predefined first setting duty ratio, detecting a measured value of the power of the microwave output from the microwave generator by using a calibration measuring device for each setting power level with regard to at least two setting power levels, and calculating an error of the measured value of the power with respect to the setting power level for each setting power level;
    calculating a correction value for the power for each setting power level on the basis of the error, and determining a first function indicating a relationship between the setting power level and the correction value at the first setting duty ratio by logarithmically approximating the relationship between the setting power level and the correction value; and
    determining the correction function indicating a relationship among the setting duty ratio, the setting power level, and the correction value by approximating the correction value at the first setting duty ratio, defined by the first function, and the correction value which is predefined at a setting duty ratio of 100%, with a linear function.

2. The method of determining a correction function according to claim 1,
    wherein the predefined correction value at the setting duty ratio of 100% is 0.

3. The method of determining a correction function according to claim 1,
    wherein the correction function is a function for determining a correction value at a duty ratio equal to or higher than the first setting duty ratio, and
    wherein, in the determining, a correction function at the first setting duty ratio or less is separately determined.

4. The method of determining a correction function according to claim 2,
    wherein the correction function is a function for determining a correction value at a duty ratio equal to or higher than the first setting duty ratio, and
    wherein, in the determining, a correction function at the first setting duty ratio or less is separately determined.

5. The method of determining a correction function according to claim 1,
    wherein the microwave has a single frequency peak.

6. The method of determining a correction function according to claim 2,
    wherein the microwave has a single frequency peak.

7. The method of determining a correction function according to claim 3,
    wherein the microwave has a single frequency peak.

8. The method of determining a correction function according to claim 1,
    wherein the correction function applied to a microwave having a single frequency peak is determined by executing the measuring, the calculating, and the determining by using the microwave having the single frequency peak, and
    wherein the method further comprises
    setting a setting duty ratio of a pulse to a predefined second setting duty ratio, detecting a measured value of the power of the microwave having a bandwidth, output from the microwave generator by using the calibration measuring device for each setting power level with regard to at least two setting power levels, and calculating an error of the measured value of the power with respect to the setting power level for each setting power level;
    calculating a difference between the error applied to the microwave having the single frequency peak and the error applied to the microwave having the bandwidth for each setting power level;
    calculating a revision value with respect to the correction value for the power of the microwave having the single frequency peak for each setting power level on the basis of the difference, and determining a second function indicating a relationship between the setting power level and the revision value at the first setting power ratio by logarithmically approximating the relationship between the setting power level and the revision value;

determining a revision term indicating a relationship among the setting duty ratio, the setting power level, and the revision value by approximating the revision value at the second setting duty ratio, defined by the second function, and the revision value which is predefined at the setting duty ratio of 100%, with a linear function; and determining the correction function applied to the microwave having the bandwidth on the basis of the revision term and the correction function applied to the microwave having the single frequency peak.

9. The method of determining a correction function according to claim 2, wherein the correction function applied to a microwave having a single frequency peak is determined by executing the measuring, the calculating, and the determining by using the microwave having the single frequency peak, and wherein the method further comprises setting a setting duty ratio of a pulse to a predefined second setting duty ratio, detecting a measured value of the power of the microwave having a bandwidth, output from the microwave generator by using the calibration measuring device for each setting power level with regard to at least two setting power levels, and calculating an error of the measured value of the power with respect to the setting power level for each setting power level;

calculating a difference between the error applied to the microwave having the single frequency peak and the error applied to the microwave having the bandwidth for each setting power level;

calculating a revision value with respect to the correction value for the power of the microwave having the single frequency peak for each setting power level on the basis of the difference, and determining a second function indicating a relationship between the setting power level and the revision value at the first setting duty ratio by logarithmically approximating the relationship between the setting power level and the revision value;

determining a revision term indicating a relationship among the setting duty ratio, the setting power level, and the revision value by approximating the revision value at the second setting duty ratio, defined by the second function, and the revision value which is predefined at the setting duty ratio of 100%, with a linear function; and determining the correction function applied to the microwave having the bandwidth on the basis of the revision term and the correction function applied to the microwave having the single frequency peak.

10. The method of determining a correction function according to claim 3, wherein the correction function applied to a microwave having a single frequency peak is determined by executing the measuring, the calculating, and the determining by using the microwave having the single frequency peak, and wherein the method further comprises setting a setting duty ratio of a pulse to a predefined second setting duty ratio, detecting a measured value of the power of the microwave having a bandwidth, output from the microwave generator by using the calibration measuring device for each setting power level with regard to at least two setting power levels, and calculating an error of the measured value of the power with respect to the setting power level for each setting power level;

calculating a difference between the error applied to the microwave having the single frequency peak and the error applied to the microwave having the bandwidth for each setting power level;

calculating a revision value with respect to the correction value for the power of the microwave having the single frequency peak for each setting power level on the basis of the difference, and determining a second function indicating a relationship between the setting power level and the revision value at the first setting duty ratio by logarithmically approximating the relationship between the setting power level and the revision value;

determining a revision term indicating a relationship among the setting duty ratio, the setting power level, and the revision value by approximating the revision value at the second setting duty ratio, defined by the second function, and the revision value which is predefined at the setting duty ratio of 100%, with a linear function; and determining the correction function applied to the microwave having the bandwidth on the basis of the revision term and the correction function applied to the microwave having the single frequency peak.

11. The method of determining a correction function according to claim 4, wherein the correction function applied to a microwave having a single frequency peak is determined by executing the measuring, the calculating, and the determining by using the microwave having the single frequency peak, and wherein the method further comprises setting a setting duty ratio of a pulse to a predefined second setting duty ratio, detecting a measured value of the power of the microwave having a bandwidth, output from the microwave generator by using the calibration measuring device for each setting power level with regard to at least two setting power levels, and calculating an error of the measured value of the power with respect to the setting power level for each setting power level;

calculating a difference between the error applied to the microwave having the single frequency peak and the error applied to the microwave having the bandwidth for each setting power level;

calculating a revision value with respect to the correction value for the power of the microwave having the single frequency peak for each setting power level on the basis of the difference, and determining a second function indicating a relationship between the setting power level and the revision value at the first setting duty ratio by logarithmically approximating the relationship between the setting power level and the revision value;

determining a revision term indicating a relationship among the setting duty ratio, the setting power level, and the revision value by approximating the revision value at the second setting duty ratio, defined by the second function, and the revision value which is predefined at the setting duty ratio of 100%, with a linear function; and determining the correction function applied to the microwave having the bandwidth on the basis of the revision term and the correction function applied to the microwave having the single frequency peak.

12. The method of determining a correction function according to claim 5, wherein the correction function applied to a microwave having a single frequency peak is determined by executing the measuring, the calculating, and the determining by using the microwave having the single frequency peak, and wherein the method further comprises setting a setting duty ratio of a pulse to a predefined second setting duty ratio, detecting a measured value of the power of the microwave having a bandwidth, output from the microwave generator by using the calibration measuring device for each setting power level with regard to at least two setting power levels, and calculating an error of the measured value of the power with respect to the setting power level for each setting power level;

calculating a difference between the error applied to the microwave having the single frequency peak and the error applied to the microwave having the bandwidth for each setting power level;

calculating a revision value with respect to the correction value for the power of the microwave having the single frequency peak for each setting power level on the basis of the difference, and determining a second function indicating a relationship between the setting power level and the revision value at the first setting duty ratio by logarithmically approximating the relationship between the setting power level and the revision value;

determining a revision term indicating a relationship among the setting duty ratio, the setting power level, and the revision value by approximating the revision value at the second setting duty ratio, defined by the second function, and the revision value which is predefined at the setting duty ratio of 100%, with a linear function; and determining the correction function applied to the microwave having the bandwidth on the basis of the revision term and the correction function applied to the microwave having the single frequency peak.

13. The method of determining a correction function according to claim 6, wherein the correction function applied to a microwave having a single frequency peak is determined by executing the measuring, the calculating, and the determining by using the microwave having the single frequency peak, and wherein the method further comprises setting a setting duty ratio of a pulse to a predefined second setting duty ratio, detecting a measured value of the power of the microwave having a bandwidth, output from the microwave generator by using the calibration measuring device for each setting power level with regard to at least two setting power levels, and calculating an error of the measured value of the power with respect to the setting power level for each setting power level;

calculating a difference between the error applied to the microwave having the single frequency peak and the error applied to the microwave having the bandwidth for each setting power level;

calculating a revision value with respect to the correction value for the power of the microwave having the single frequency peak for each setting power level on the basis of the difference, and determining a second function indicating a relationship between the setting power level and the revision value at the first setting duty ratio by logarithmically approximating the relationship between the setting power level and the revision value;

determining a revision term indicating a relationship among the setting duty ratio, the setting power level, and the revision value by approximating the revision value at the second setting duty ratio, defined by the second function, and the revision value which is predefined at the setting duty ratio of 100%, with a linear function; and determining the correction function applied to the microwave having the bandwidth on the basis of the revision term and the correction function applied to the microwave having the single frequency peak.

14. The method of determining a correction function according to claim 7, wherein the correction function applied to a microwave having a single frequency peak is determined by executing the measuring, the calculating, and the determining by using the microwave having the single frequency peak, and wherein the method further comprises setting a setting duty ratio of a pulse to a predefined second setting duty ratio, detecting a measured value of the power of the microwave having a bandwidth, output from the microwave generator by using the calibration measuring device for each setting power level with regard to at least two setting power levels, and calculating an error of the measured value of the power with respect to the setting power level for each setting power level;

calculating a difference between the error applied to the microwave having the single frequency peak and the error applied to the microwave having the bandwidth for each setting power level;

calculating a revision value with respect to the correction value for the power of the microwave having the single frequency peak for each setting power level on the basis of the difference, and determining a second function indicating a relationship between the setting power level and the revision value at the first setting duty ratio by logarithmically approximating the relationship between the setting power level and the revision value;

determining a revision term indicating a relationship among the setting duty ratio, the setting power level, and the revision value by approximating the revision value at the second setting duty ratio, defined by the second function, and the revision value which is predefined at the setting duty ratio of 100%, with a linear function; and determining the correction function applied to the microwave having the bandwidth on the basis of the revision term and the correction function applied to the microwave having the single frequency peak.

* * * * *